(12) United States Patent
Rodriguez et al.

(10) Patent No.: US 6,830,938 B1
(45) Date of Patent: Dec. 14, 2004

(54) METHOD FOR IMPROVING RETENTION RELIABILITY OF FERROELECTRIC RAM

(75) Inventors: John Anthony Rodriguez, Richardson, TX (US); Shan Sun, Colorado Springs, CO (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/602,943

(22) Filed: Jun. 24, 2003

(51) Int. Cl.⁷ .............................................. H01L 21/00
(52) U.S. Cl. .............................. 438/3; 438/14; 438/15; 438/17; 438/18
(58) Field of Search ............................... 438/3, 14, 15, 438/17, 18; 324/658, 201

(56) References Cited

U.S. PATENT DOCUMENTS

| | | | | |
|---|---|---|---|---|
| 5,661,730 A | * | 8/1997 | Mitra et al. ................. | 714/720 |
| 5,969,935 A | * | 10/1999 | Kammerdiner et al. ..... | 361/311 |
| 6,008,659 A | * | 12/1999 | Traynor ....................... | 324/658 |
| 6,238,933 B1 | | 5/2001 | Sun et al. | |
| 6,541,375 B1 | | 4/2003 | Hayashi et al. | |

OTHER PUBLICATIONS

"Fatigue and Retention Reliability of Low Voltage PZT Ferroelectric Films", J. Rodriguez, S. Aggarwal, S. Martin, S. Summerfelt, K.R. Udayakumar, T. Moise, R. Bailey, F. Chu, S. Sun, G. Fox and T. Davenport, Abstract/Conference presentation, Mar., 2003, 2 pgs.

"Polarization as a Driving Force in Accelerated Retention Measurements on Ferroelectric Thin Films", S. D. Traynor, IEEE, 1998, pp. 15–18.

* cited by examiner

*Primary Examiner*—Hsien-Ming Lee
(74) *Attorney, Agent, or Firm*—Jacqueline J. Garner; W. James Brady, III; Frederick J. Telecky, Jr.

(57) ABSTRACT

The present invention can improve and/or modify data retention lifetimes for ferroelectric devices by baking them prior to or during packaging. A ferroelectric device is programmed to a particular state and then baked for a selected period of time at a selected temperature. This pre-baking or imprinting causes the device to be imprinted or have a preference for the particular state and reduces loss of signal margin over time, thereby at least partially preserving data retention capabilities.

23 Claims, 16 Drawing Sheets

METHOD FOR IMPROVING RETENTION RELIABILITY OF FERROELECTRIC RAM

FIELD OF THE INVENTION

The present invention relates generally to memory devices, and more particularly, to systems and methods that facilitate retention reliability of ferroelectric memory devices.

BACKGROUND OF THE INVENTION

Several trends exist, today, in the semiconductor device fabrication industry and the electronics industry. Devices are continuously getting smaller and requiring less power. A reason for this is that more personal devices are being fabricated which are very small and portable, thereby relying on a small battery as its supply source. For example, cellular phones, personal computing devices, and personal sound systems, personal digital assistants, and the like are devices that are in great demand in the consumer market. In addition to being smaller and more portable, personal devices are requiring more computational power and on-chip memory. In light of all these trends, there is a need in the industry to provide a computational device that has a fair amount of memory and logic functions integrated onto the same semiconductor chip. Preferably, this memory will be configured such that if the battery dies, the contents of the memory will be retained. Such a memory device which retains its contents while a signal is not continuously applied to it is called a non-volatile memory. Examples of conventional non-volatile memory include: electrically erasable, programmable read only memory ("EEPROM") and FLASH EEPROM.

A ferroelectric memory (FRAM) is a non-volatile memory which utilizes a ferroelectric material as the capacitor dielectric situated between a bottom electrode and a top electrode. Both read and write operations are performed for a FRAM. The memory size and memory architecture affect the read and write access times of a FRAM. Table 1 illustrates the differences between different memory types.

TABLE 1

| Property | SRAM | Flash | DRAM | FRAM (Demo) |
|---|---|---|---|---|
| Voltage | >0.5 V | Read >0.5 V Write (12 V) (±6 V) | >1 V | 3.3 V |
| Special Transistors | NO | YES (High Voltage) | YES (Low Leakage) | NO |
| Write Time | <10 ns | 100 ms | <30 ns | 60 ns |
| Write Endurance | >$10^{15}$ | <$10^5$ | >$10^{15}$ | >$10^{13}$ |
| Read Time (single/multi bit) | <10 ns | <30 ns | <30 ns/<2 ns | 60 ns |
| Read Endurance | >$10^{15}$ | >$10^{15}$ | >$10^{15}$ | >$10^{13}$ |
| Added Mask for embedded | 0 | ~6–8 | ~6–8 | ~3 |
| Cell Size (F~metal pitch/2) | ~80 $F^2$ | ~8 $F^2$ | ~8 $F^2$ | ~18 $F^2$ |
| Architecture | NDRO | NDRO | DRO | DRO |
| Non volatile | NO | YES | NO | YES |
| Storage | I | Q | Q | P |

The non-volatility of an FRAM is due to the bi-stable characteristic of the ferroelectric memory cell. Two types of memory cells are typically used, a single capacitor memory cell and a dual capacitor memory cell. The single capacitor memory cell (referred to as a 1T/1C or 1C memory cell) requires less silicon area (thereby increasing the potential density of the memory array), but is less immune to noise and process variations. Additionally, a 1C cell requires a voltage reference for determining a stored memory state. The dual capacitor memory cell (referred to as a 2T/2C or 2C memory cell) requires more silicon area, and it stores complementary signals allowing differential sampling of the stored information. The 2C memory cell is more stable than a 1C memory cell.

As illustrated in prior art FIG. 1, a 1T/1C FRAM cell 10 includes one transistor 12 and one ferroelectric storage capacitor 14. A bottom electrode of the storage capacitor 14 is connected to a drain terminal 15 of the transistor 12. The 1T/1C cell 10 is read from by applying a signal to the gate 16 of the transistor (word line WL)(e.g., the Y signal), thereby connecting the bottom electrode of the capacitor 14 to the source of the transistor (the bit line BL) 18. A pulse signal is then applied to the top electrode contact (the plate line or drive line DL) 20. The potential on the bit fine 18 of the transistor 12 is, therefore, the capacitor charge divided by the bit line capacitance. Since the capacitor charge is dependent upon the bi-stable polarization state of the ferroelectric material, the bit line potential can have two distinct values. A sense amplifier (not shown) is connected to the bit line 18 and detects the voltage associated with a logic value of either 1 or 0. Frequently the sense amplifier reference voltage is a ferroelectric or non-ferroelectric capacitor connected to another bit line that is not being read. In this manner, the memory cell data is retrieved.

A characteristic of the shown ferroelectric memory cell is that a read operation is destructive. The data in a memory cell is then rewritten back to the memory cell after the read operation is completed. If the polarization of the ferroelectric is switched, the read operation is destructive and the sense amplifier must rewrite (onto that cell) the correct polarization value as the bit just read from the cell. This is similar to the operation of a DRAM. The one difference from a DRAM is that a ferroelectric memory cell will retain its state until it is interrogated, thereby eliminating the need of refresh.

As illustrated, for example, in prior art FIG. 2, a 2T/2C memory cell 30 in a memory array couples to a bit line 32 and an inverse of the bit line ("bit line-bar") 34 that is common to many other memory types (for example, static random access memories). Memory cells of a memory block are formed in memory rows and memory columns. The dual capacitor ferroelectric memory cell comprises two transistors 36 and 38 and two ferroelectric capacitors 40 and 42, respectively. The first transistor 36 couples between the bit line 32 and a first capacitor 40, and the second transistor 38 couples between the bit line-bar 34 and the second capacitor 42. The first and second capacitors 40 and 42 have a common terminal or plate (the drive line DL) 44 to which a signal is applied for polarizing the capacitors.

In a write operation, the first and second transistors 36 and 38 of the dual capacitor ferroelectric memory cell 30 are enabled (e.g., via their respective word line 46) to couple the capacitors 40 and 42 to the complementary logic levels on the bit line 32 and the bit line-bar 34 corresponding to a logic state to be stored in memory. The common terminal 44 of the capacitors is pulsed during a write operation to polarize the dual capacitor memory cell 30 to one of the two logic states.

In a read operation, the first and second transistors 36 and 38 of the dual capacitor memory cell 30 are enabled via the word line 46 to couple the information stored on the first and second capacitors 40 and 42 to the bar 32 and the bit line-bar

34, respectively. A differential signal (not shown) is thus generated across the bit line 32 and the bit line-bar 34 by the dual capacitor memory cell 30. The differential signal is sensed by a sense amplifier (not shown) that provides a signal corresponding to the logic level stored in memory.

As stated above, a ferroelectric capacitor includes a ferroelectric layer as a dielectric material sandwiched between a bottom electrode and a top electrode. The various read/write operations described supra utilize the ferroelectric properties, polarization, of the ferroelectric layer. However, over time, the ferroelectric properties of the ferroelectric capacitor can alter.

Data retention is the ability of a memory cell, particularly a non-volatile memory cell, to properly maintain stored data. Proper operation, including data retention, of ferroelectric memory devices depends on the bi-stable characteristic of the ferroelectric memory cell described above. However, over time, the bi-stable characteristic can degrade significantly and negatively affect data retention. Thus, ferroelectric memory devices can, over time, become unusable for some applications.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The instant invention relates to the fabrication and modification of ferroelectric memory devices, which are either stand-alone devices or integrated onto a semiconductor chip that includes other device types. Additionally, the instant invention relates to testing and analyzing data retention capabilities for ferroelectric memory devices.

The present invention can improve and/or modify data retention lifetimes for ferroelectric devices by baking them prior to or during packaging. A ferroelectric device is programmed to a particular state and then baked for a selected period of time at a selected temperature. This baking causes the device to be imprinted or have a preference for the particular state and reduces loss of signal margin over time, thereby at least partially preserving data retention capabilities.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

The present invention will now be described with respect to the accompanying drawings in which like numbered elements represent like parts. The figures provided herewith and the accompanying description of the figures are merely provided for illustrative purposes. One of ordinary skill in the art should realize, based on the instant description, other implementations and methods for fabricating the devices and structures illustrated in the figures and in the following description.

The instant invention relates to the fabrication and modification of ferroelectric memory devices, which are either stand-alone devices or integrated onto a semiconductor chip that includes other device types. Additionally, the instant invention relates to testing and analyzing data retention capabilities for ferroelectric memory devices.

Ferroelectric memory (FRAM) devices are non-volatile, as discussed supra. However, the inventors of the present invention appreciate that over time and/or at elevated temperatures, ferroelectric memory devices tend to preferentially stabilize in a stored state, thereby reducing the lifetime of the opposite state. As a result, data retention capabilities for ferroelectric memory devices can degrade over time and/or at elevated temperatures. The length of time until devices are expected to have their data retention capabilities critically degraded is referred to as their data retention lifetime. It is appreciated that the data retention lifetime is at least partially a result of simulations and can be considered to be an estimate of a device's actual lifetime.

The inventors of the present invention note that some mechanisms for modifying or improving data retention lifetimes include process development, material/dopant selection, and architecture selection. Processes employed in fabrication can be adjusted in order to reduce defects that lead to loss of signal margin and data retention. Material selection and dopant selection can be adjusted to compensate for defects in processing or fabrication to reduce a rate of imprint or reduce establishing a preferential state. Selection of architectures, such as 2T/2C, can be employed to also improve/modify data retention lifetimes.

The present invention analyzes and identifies data retention capabilities and data retention lifetimes of ferroelectric memory devices. Further, the present invention can improve data retention lifetimes for ferroelectric memory devices by stabilizing of imprinting ferroelectric memory cells into a specific, pre-programmed state.

Figure 1:
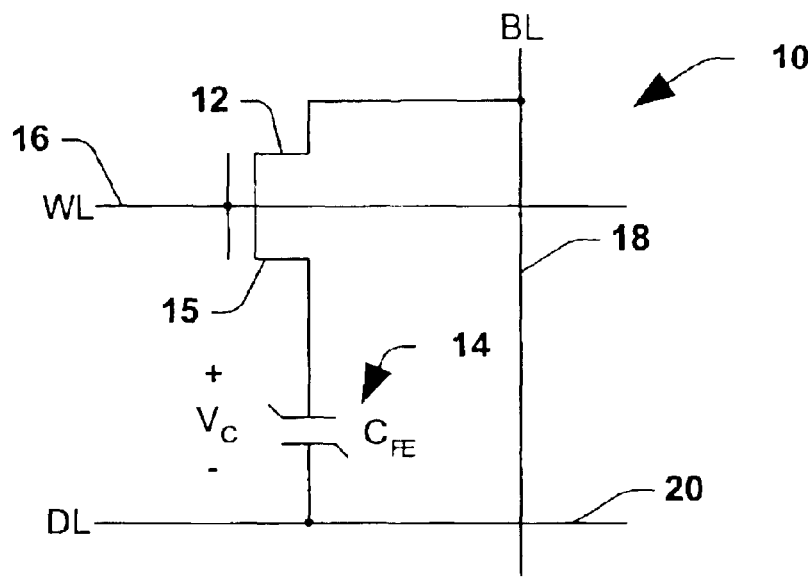
FIG. 1 is a schematic view of a conventional 1T/1C FRAM cell.
Figure 2:
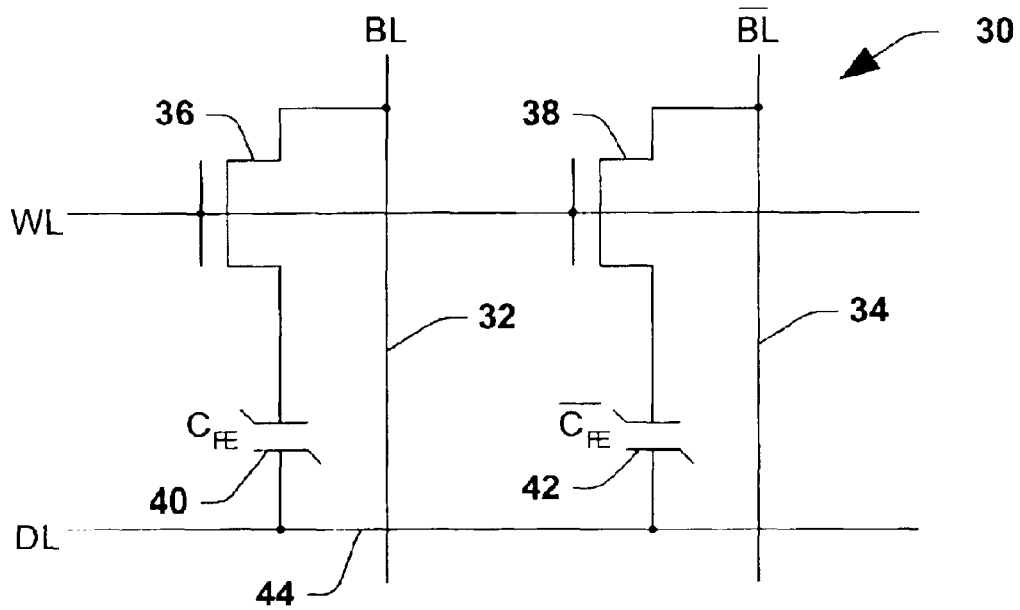
FIG. 2 is a schematic view of a conventional 2T/2C FRAM cell.
Figure 3:
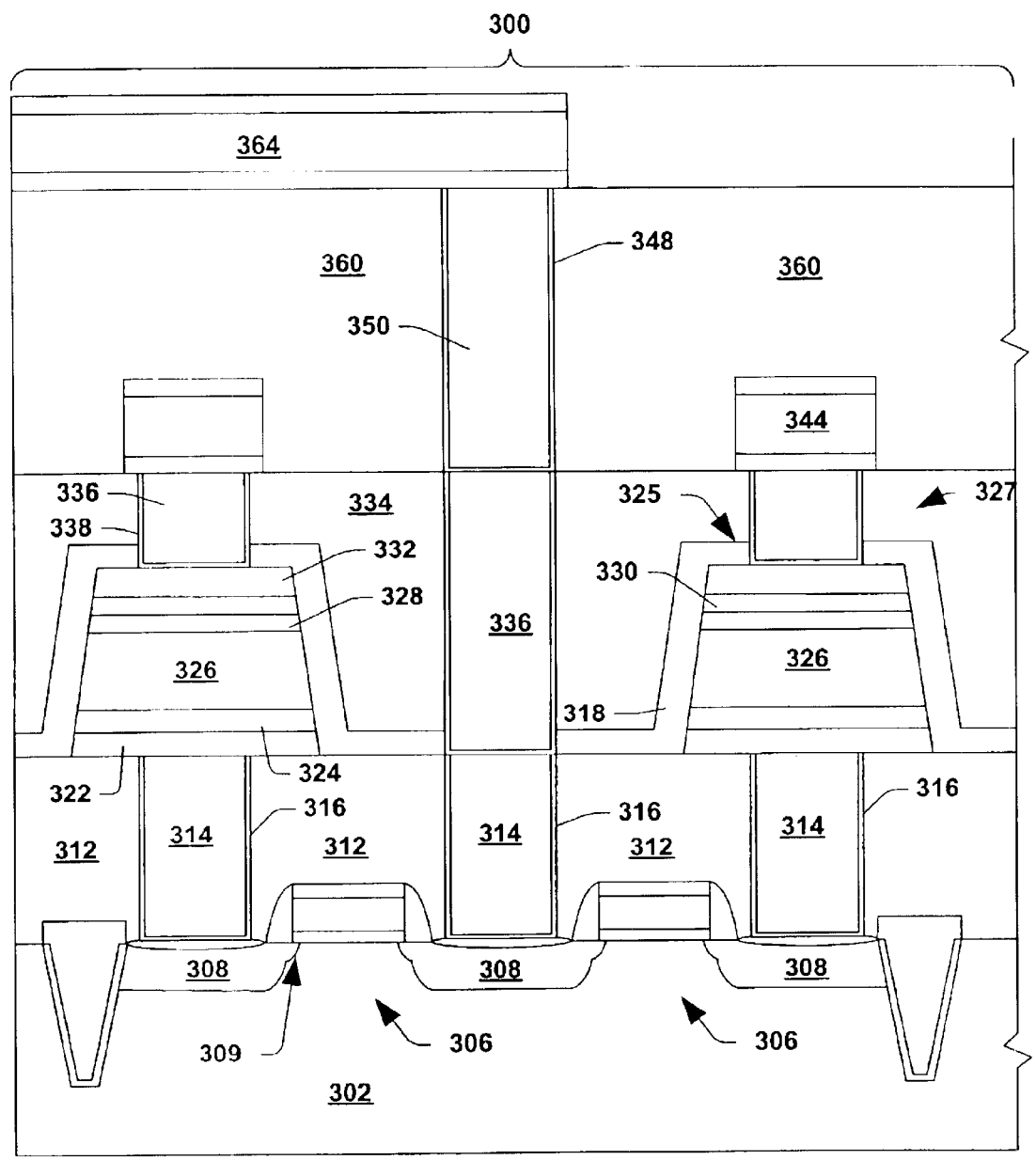
FIG. 3 is a cross sectional view of an exemplary ferroelectric semiconductor device in accordance with an aspect of the present invention.

Referring initially to FIG. 3, a cross section of an exemplary ferroelectric semiconductor device 300 is illustrated in accordance with an aspect of the present invention. The device 300 represents a partially fabricated version of an ferroelectric memory (FRAM) cell in accordance with the present invention. It is appreciated that the device 300 is but one example of many suitable ferroelectric memory devices in accordance with the present invention. Accordingly, it is also appreciated that suitable variations of the device 300 are contemplated in accordance with the present invention.

Gate structures 306 include a gate dielectric (for example, comprising silicon dioxide, an oxynitride, a silicon nitride, BST, PZT, a silicate, any other high-k material, or any combination or stack thereof), a gate electrode (for example, comprising polycrystalline silicon doped either p-type or n-type with a silicide formed on top, or a metal such as titanium, tungsten, TiN, tantalum, TaN or other type metal). The gate structures 306 further comprise side wall insulators (for example, comprising an oxide, a nitride, an oxynitride, or a combination or stack thereof). In general, the generic terms oxide, nitride and oxynitride refer to silicon oxide, silicon nitride and silicon oxy-nitride. The term "oxide" may, in general, include doped oxides as well, such as boron and/or phosphorous doped silicon oxide. Source/drain regions 308 may be formed via, for example, implantation using conventional dopants and processing conditions. Lightly doped drain extensions 309 as well as pocket implants may also be utilized. In addition, the source/drain regions 308 may be silicided (for example, with titanium, cobalt, nickel, tungsten or other conventional silicide material).

A dielectric layer 312 is formed over the entire substrate 302 and is patterned and etched so as to form openings for contacts to the substrate and gate structures 306 to be formed. These openings are filled subsequently with one or more conductive materials, such as a plug 314 (for example, comprising a metal such as tungsten, molybdenum, titanium, titanium nitride, tantalum nitride, or a metal silicide such as Ti, Ni or Co, copper or doped polysilicon). A liner/barrier layer 316 may or may not be formed between the plug 314 and dielectric 312. Such a liner/barrier layer 316 is illustrated in FIG. 3 and comprises, for example, Ti, TiN, TaSiN, Ta, TaN, TiSiN, a stack thereof, or any other conventional liner/barrier material. Preferably, the contacts are formed so as to land on the silicided regions of the source/drain regions and gate structures.

The dielectric layer 312 comprises, for example, $SiO_2$ (doped or undoped with dopants such as boron or phosphorous) possibly with a layer of hydrogen or deuterium containing silicon nitride next to the gate. After deposition of the diffusion barrier 316 it is likely that the barrier will be planarized for improved lithography of overlying layers using a process such as chemical mechanical polishing (CMP). In addition, an added diffusion barrier/etch stop (not shown) may be included near the top surface of layer 312 such as $AlO_x$, AlN, $Si_3N_4$, $TiO_2$, $ZrO_2$, or $TaO_x$ that would be deposited after the planarization process. This diffusion barrier is particularly useful if damascene processes are used to create the via or metallization to the contact. The formation of the plug 314 will require etching through this optional barrier/etch stop.

Formation of metal structures which are situated above the contacts is considered to be part of the back end processes. Other than the specific FRAM process module, the back end process steps may be those standard in the semiconductor industry. The metallization may be, for example, either Al or Cu based. The Al is preferably etched while the Cu is preferably used in a damascene approach. However, etching Cu and Al formed in a damascene process is also possible. According to one example, aluminum metallization will preferably have CVD tungsten plugs or Al plugs, and the Al will preferably be Cu-doped for improved electromigration resistance. Metal diffusion barriers for Al may include, for example, TiN and/or Ti. Copper metallization may have, for example, Cu or W plugs with either Ti, TiN, TiSiN, Ta, tantalum nitride, and/or TaSiN diffusion barriers.

A thin dielectric layer (not shown) may be formed between each of the interlevel dielectric (ILD) layers (layers 312, 334 and 360). If formed, this thin dielectric comprises, for example, silicon nitride, silicon carbide, SiCNO or a silicon oxide (for example, a high-density plasma oxide). In addition, interlevel dielectric layers 312, 334, and 360 may comprise, for example, an oxide, FSG, PSG, BPSG, PETEOS, HDP oxide, a silicon nitride, silicon oxynitride, silicon carbide, silicon carbo-oxy-nitride, a low dielectric constant material (for example, SiLK, porous SiLK, teflon, low-K polymer (possibly porous), aerogel, xerogel, BLACK DIAMOND, HSQ, or any other porous glass material), or a combination or stack thereof.

The interconnects and the metal lines preferably comprise the same material. Plugs 336 and 350 and conductors 344 and 364 comprise a metal material (for example, copper, aluminum, titanium, TiN, tungsten, tungsten nitride, or any combination or stack thereof). A barrier/liner may be formed between the plug and the respective interlevel dielectric layer. If formed, the barrier/liner layer (shown as layers 338 and 348 and liners 342, 346, 362 and 366) comprises, for example, Ti, TiN, W, tungsten nitride, Ta, tantalum nitride, any conventional barrier/liner layer, or any combination or stack thereof). The interlayer dielectric and plug material should be compatible with the FRAM thermal budget. With existing technology (i.e., one that incorporates a W plug and $SiO_2$ ILD), the FRAM thermal budget should be less than approximately 600 or 650C, however, the present invention is not limited thereto. If the ILD is modified to include a low dielectric constant ("low K") layer, the FRAM thermal budget may need to be reduced further. The preferred interlayer dielectric 312 is therefore a material that can withstand a thermal budget in excess of 600 C, such as silicon oxide (doped and/or undoped), silicon nitride, and/or silicon oxy-nitride.

Level 327 is added so as to accommodate the FRAM cells (FRAM process module). This FRAM process module allows the creation of ferroelectric or high dielectric constant capacitors to be easily added with maximum thermal budget for the new process module yet not impact the thermal budget of backend process. In particular, this level allows FRAM devices with capacitor under bit line configuration compatible with a high-density memory. However, it is possible, if planarity is not a necessity, to form the FRAM devices while not forming layer 327 in region 305.

An FRAM capacitor, as illustrated in FIG. 3 at reference numeral 325, resides above the interlayer dielectric 312, and comprises several layers. The FRAM capacitor 325 of FIG. 3 comprises an electrically conductive barrier layer 322 upon which a conductive bottom capacitor electrode 324 resides (hereinafter, the terms conductive and insulative are employed to indicate electrically conductive and electrically insulative, respectively, unless indicated otherwise). A capacitor dielectric layer 326, a ferroelectric material, is formed over the bottom electrode 324, and is covered by, for example, a conductive multi-layer top electrode 328, 330. A top portion of the FRAM capacitor 325 comprises a hard mask layer 332 which, may be employed to facilitate the capacitor stack etch. The capacitor stack is covered and/or encapsulated by a sidewall diffusion barrier layer 318.

The FRAM capacitor 325 is programmed to a particular state and baked at a selected temperature for a selected time prior to packaging. This pre-baking imprints a preference for the particular state on the FRAM capacitor 325. As a result, the FRAM capacitor 325 can have an improved data retention lifetime as compared with conventional capacitors that do not undergo such a programming and baking procedure.

Figure 4:
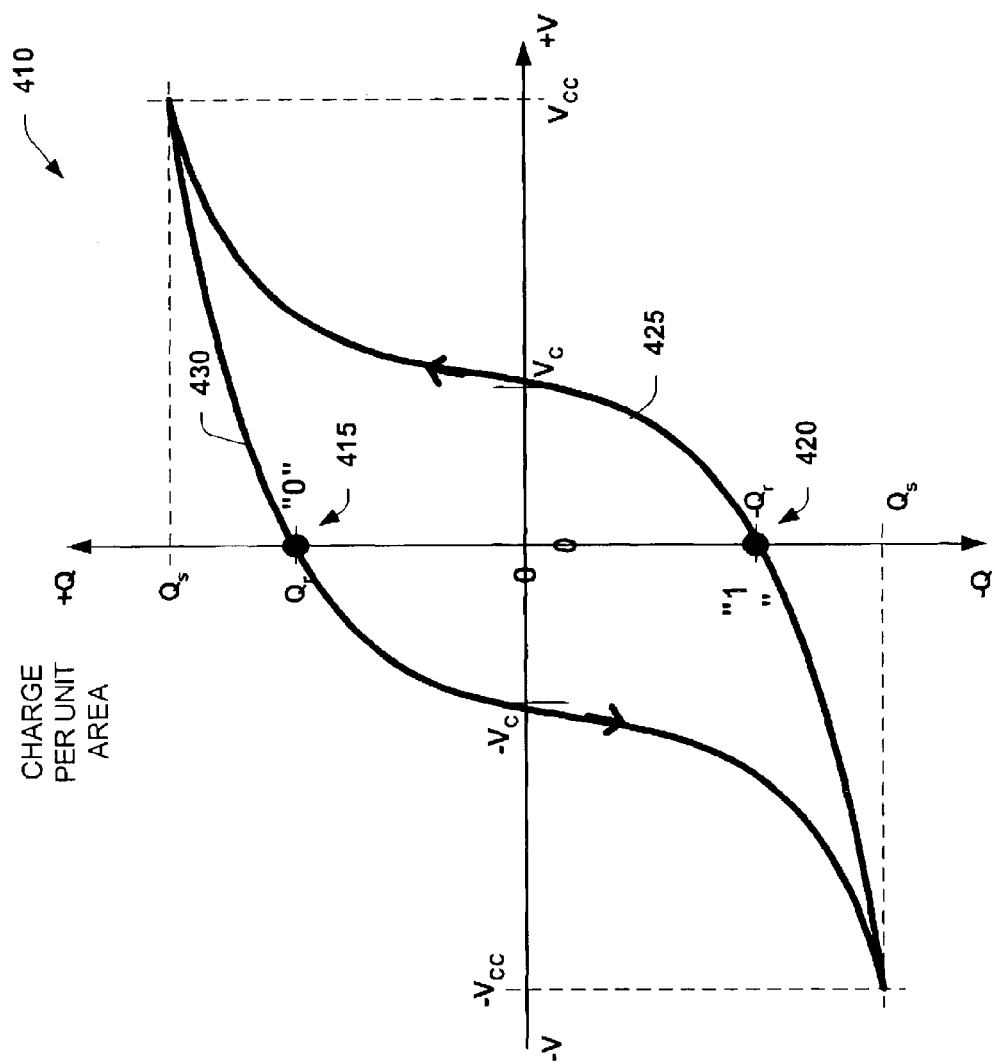
FIG. 4 is plot of an exemplary characteristic hysteresis loop for a ferroelectric capacitor in accordance with an aspect of the present invention.

A plot 410 of an exemplary characteristic hysteresis loop for a ferroelectric capacitor in accordance with an aspect of the present invention is depicted in FIG. 4, and displays the total charge on the ferroelectric capacitor as a function of the applied voltage. Plot 410 illustrates the charge "Q" (Y-axis), and the voltage "V" (X-axis). Remnant charge ($Q_r$), saturation charge ($Q_s$), and coercive voltage ($V_c$) are three important parameters that characterize the loop. When the voltage across the capacitor is 0V, the capacitor assumes one of the two stable states: "0" 415, or "1" 420. The total charge stored on the capacitor is $Q_r$ for a "0" 415 or $-Q_r$ for a "1" 420. A "0" can be switched to a "1" by applying a negative voltage pulse across the ferroelectric capacitor. By doing so, the total charge on the ferroelectric capacitor is reduced by $2Q_r$, a change of charge that can be sensed by the sense amplifier (amp). Similarly, a "1" can be switched back to a "0" by applying a positive voltage pulse across the capacitor, hence restoring the capacitor charge to $+Q_r$.

Characteristic curve segment 425 represents the charge path of a ferroelectric capacitor from a "1" state 420, thru $V_{cc}$ as charge is applied, and then thru curve segment 430 to the other stable "0" state 415 as the voltage is relaxed to the ferroelectric capacitor.

Data in a ferroelectric memory cell is read by connecting a reference voltage to a first bit line, connecting the cell capacitor between a complimentary bit line and a plate line signal voltage, and interrogating the cell. There are several suitable techniques to interrogate an FRAM cell. Two suitable interrogation techniques that can be employed are step sensing and pulse sensing. In both these interrogation techniques, the cell capacitor is coupled to the complimentary bit line by turning ON an access or a pass gate transistor. In the step sensing, the plate line voltage is stepped from ground (Vss) to a supply voltage (Vdd). In the pulse sensing the plate line voltage is pulsed from Vss to Vdd and then back to Vss. This provides a differential voltage on the bit line pair, which is connected to a sense amp circuit. The reference voltage is typically supplied at an intermediate voltage between a voltage (Vss) associated with a capacitor programmed to a binary "0" 415 of FIG. 4, and that of the capacitor programmed to a binary "1" ($V_{-1}$) 420 (e.g., an intermediate voltage of about ½ $V_{cc}$). The resulting differential voltage at the sense amp terminals represents the data stored in the cell, which is buffered and applied to a pair of local IO lines.

The transfer of data between the FRAM, the sense amp circuit, and the local data bit lines is controlled by various access transistors, typically MOS devices, with switching signals being provided by control circuitry in the device. In a typical ferroelectric memory read sequence, the two sense amp bit lines are initially pre-charged to ground, and then floated, after which a target ferroelectric memory cell is connected to one of the sense amp bit lines and interrogated. Thereafter, a reference voltage is connected to the remaining sense amp bit line, and a sense amp senses the differential voltage across the bit lines and latches a voltage indicative of whether the target cell was programmed to a binary "0" or to a "1".

FIG. 4 and the accompanying description are provided for illustrative purposes and are not intended to be a complete description of the operation of a ferroelectric capacitor, but merely to highlight some aspects of its operation.

Figure 5:
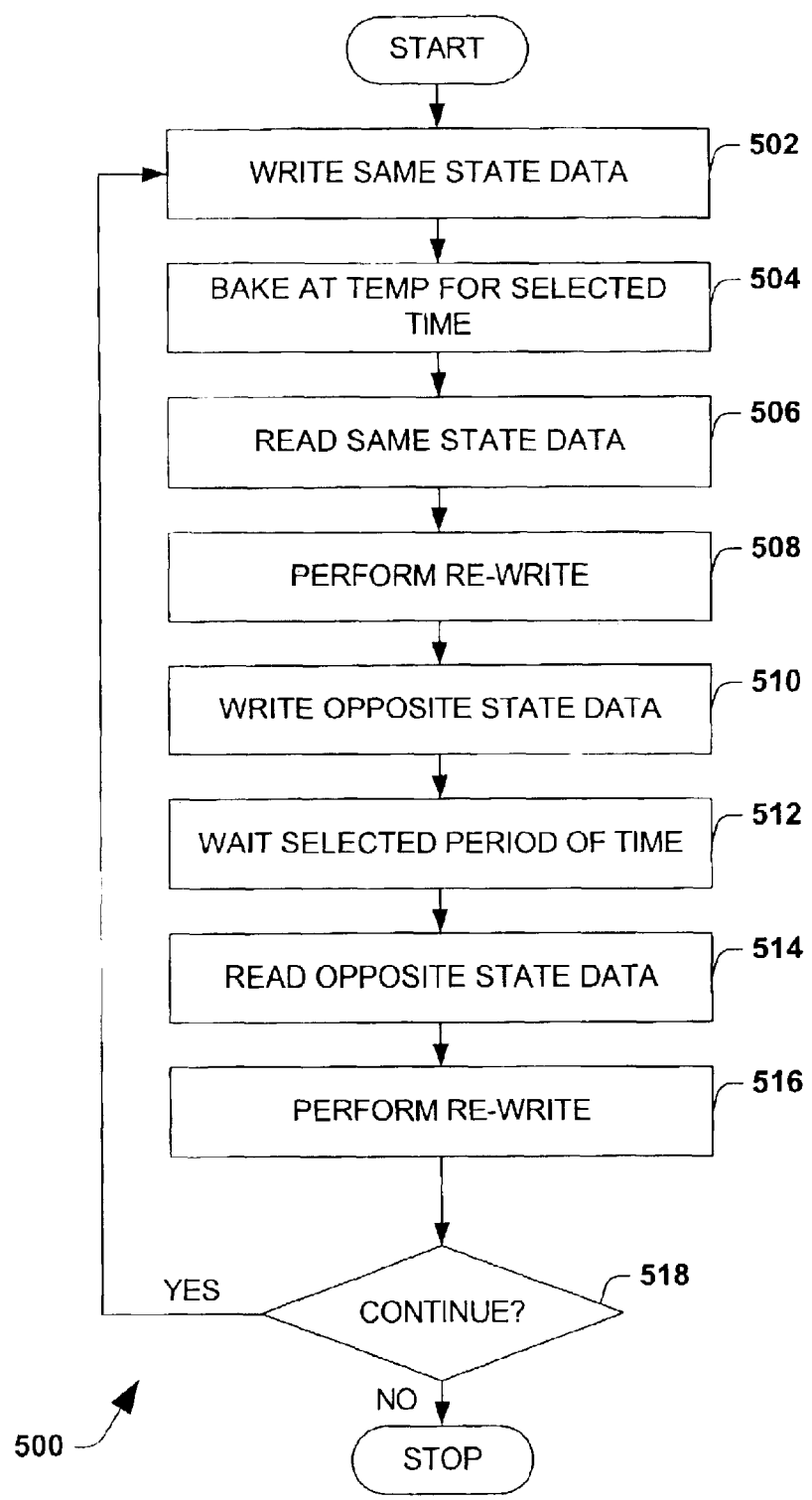
FIG. 5 is a flow diagram illustrating a method of analyzing ferroelectric capacitor degradation and lifetime in accordance with an aspect of the present invention.

Turning now to FIG. 5, a flow diagram illustrating a method 500 of analyzing ferroelectric capacitor degradation is provided. The method 500 employs a first and second ferroelectric capacitors, also referred to as CAP A and CAP B in order to identify opposite state signal errors resulting from stabilization in a particular state. The method 500 provides an indication of the quality of the material employed with and the fabrication process of ferroelectric memory devices. Additionally, the method 500 can provide an indication of an expected operational lifetime for the ferroelectric capacitors. Typically, the capacitors (CAP A and CAP B) are selected/sampled from a lot or population of ferroelectric capacitors in order to estimate lifetime performance of the lot or population.

A general hysteresis loop for ferroelectric memory device has been described supra with respect to FIG. 4. The hysteresis loop is central to ferroelectric device operations and permits the non-volatile nature of these memory devices. However, it is appreciated that the hysteresis loop for ferroelectric capacitors shifts at high temperatures, which can affect device operation.

High temperatures are employed by the method 500 in order to simulate operational testing over extended periods of time. Semiconductor devices are often expected to meet lifetime and operational testing conditions. For example, some devices are classified or characterized as being operable for 10 years at 105 degrees Celsius. Thus the devices should be capable of operating continuously for 10 years at 105 degrees Celsius without substantial failure. With the continuing and rapid development of semiconductor devices, it is impractical to test any device for 10 years prior to marketing and/or selling. Accordingly, high temperatures are employed to simulate devices' lifetimes and shorten the simulation testing period. Some other suitable exemplary operating temperatures in accordance with the present invention include, but are not limited to, 85 degrees Celsius, 125 degrees Celsius, 150 degrees Celsius, and the like.

It is also appreciated that ferroelectric capacitors tend to imprint or develop a "preference" for a state at which they are raised to a relatively high temperature in, also referred to as baked. The state at which the capacitors are baked in, referred to as the same state, is stable but becomes so stable that the capacitors preferentially want to stay or remain there. However, the opposite state can and often does become unstable or un-maintainable because of this developed preference for the baked or same state. This effect is referred to as imprint and the method 500 facilitates detection thereof.

Ferroelectric capacitors are written by applying a positive pulse to write a logical 0 and by applying a negative pulse to write a logical 1. As discussed previously, reading ferroelectric capacitors can be destructive. Read operations are performed by applying a positive pulse to the capacitor and interrogating the capacitor. The proper, stored value is obtained by the positive pulse leaves the capacitor in a positive state even if it was previously in a negative state (e.g., storing a 1).

The method 500 begins at 502 wherein same state data is written to the first capacitor and the second capacitor. The same state data is the initial states or values to which the capacitors are written at (e.g., the first capacitor—0, positive and the second capacitor—1, negative or the first capacitor—1, negative and the second capacitor—0, positive). The first capacitor and the second capacitor are baked for a specified period of time at a selected temperature at 504. A suitable temperature is typically in the range of about greater than 105 degrees Celsius and less than about 250 degrees Celsius. A suitable time can be about 15 minutes to about 4 hours. The baking at the elevated temperature for a period of time simulates a much longer length of time at normal operational temperatures. For example, a bake of 4 hours at 150 degrees Celsius simulates about 90 hours of operation at 105 degrees Celsius. Then, a same state read is performed at 506 that, for a properly working ferroelectric cell, should read the data originally written at 502. Otherwise, an error of one or both of the capacitors has occurred. A re-write operation is performed at 508 that accounts for destructive read operations by writing the data previously read at 506 (the same state read).

At 510, opposite state data (i.e., states opposite to that originally written to the capacitors) is written to the first capacitor and the second capacitor. Thus, if a logical 0 was initially written to the first capacitor, a logical 1 is now written to the first capacitor. A delay or wait for a selected period of time is performed at 512 to allow the first and second capacitors to achieve a steady state. Then, an opposite state read is performed at 514 in which the first capacitor and the second capacitor are read in order to identify opposite state error or imprint. A signal state margin is obtained for each capacitor by comparing voltages across the capacitors from the opposite state read with the same state read obtained at 506. The read data should match the opposite state data written at 510 if the ferroelectric material within the first and second capacitors are properly operating. However, time and elevated temperatures can cause failures at this point in the method. A re-write operation is performed at 516. The method 500 can be iteratively repeated to identify points of failure and simulate extended periods of time (e.g., product lifetime, 10 years, and the like).

In one variation of the method 500, a time zero retention is obtained prior to any bake sequences. The time zero retention is obtained by writing same state data, opposite state, or other initial data to the ferroelectric capacitors, then waiting a selected period of time (e.g., 15 minutes), reading the capacitors, and re-writing the read data.

It is appreciated that voltages across the first ferroelectric capacitor and the second ferroelectric capacitor can be obtained and stored throughout the method 500. It is also appreciated that the method 500 can be extended and adapted to employ varying amounts of capacitors instead of just two in order to identify imprint and obtain expected product or device operational lifetimes.

Figure 6A:
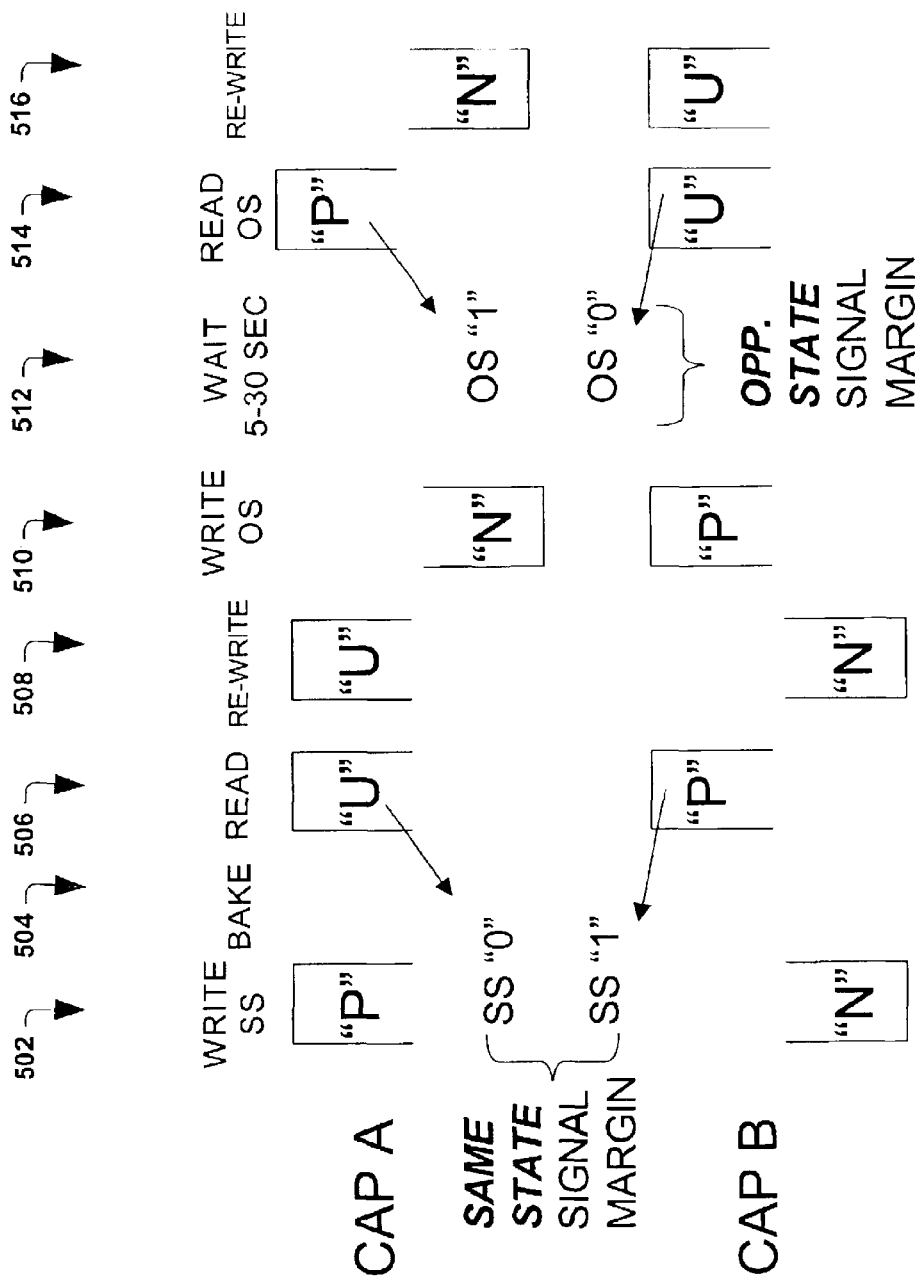
FIG. 6A is a diagram illustrating an exemplary pass through a method of analyzing ferroelectric capacitor degradation and lifetime in accordance with an aspect of the present invention.
Figure 6B:
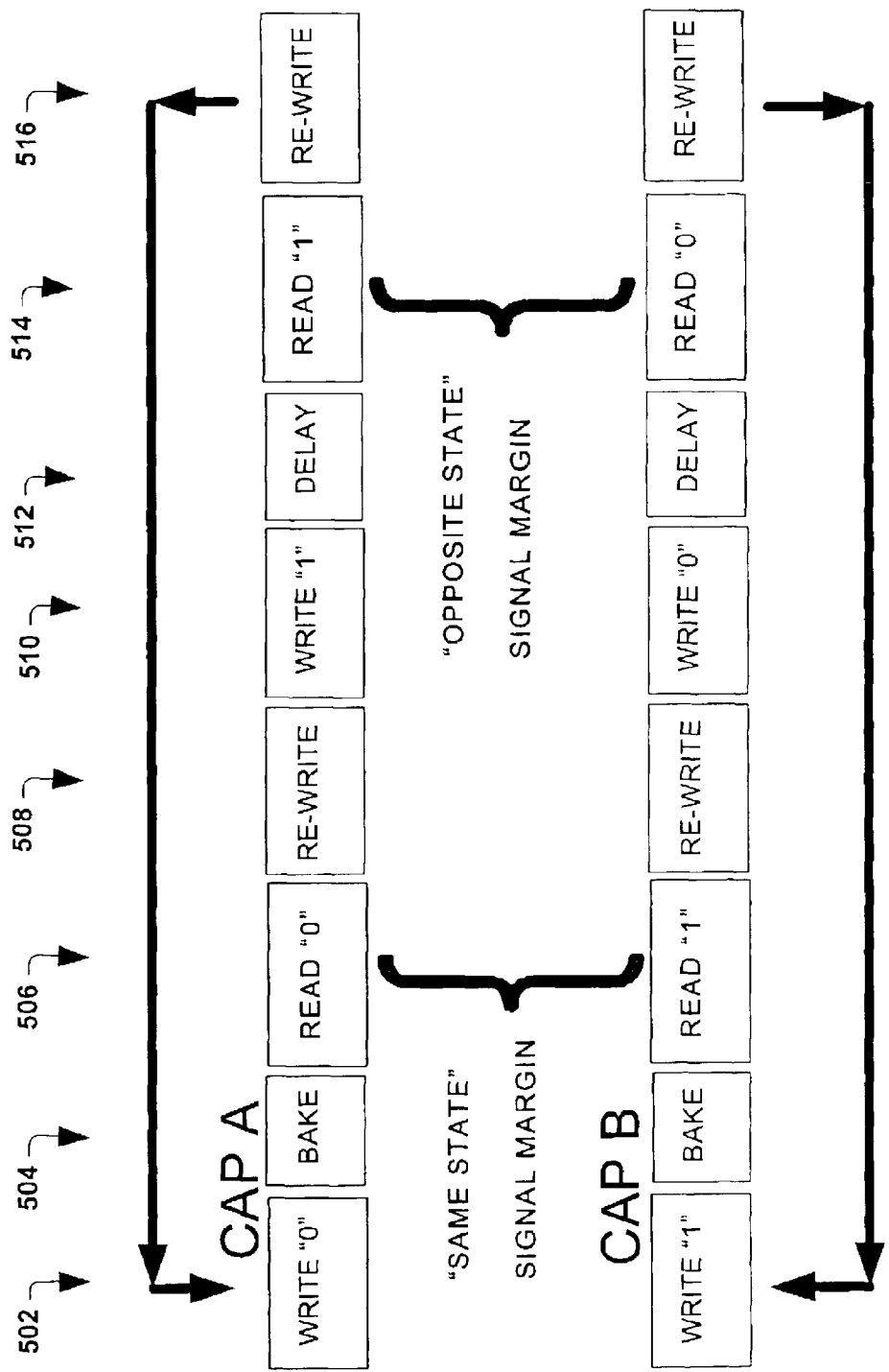
FIG. 6B is a diagram illustrating an exemplary pass through a method of analyzing ferroelectric capacitor degradation and lifetime in accordance with an aspect of the present invention.

Turning now to FIGS. 6A and 6B, diagrams illustrating an exemplary run 600 of the method 500 for testing ferroelectric capacitors in accordance with an aspect of the present invention are provided. As discussed above, the method 500 employs first and second ferroelectric capacitors designated CAP A and CAP B, respectively. The method 500 can be employed to identify opposite state signal errors resulting from stabilization in a particular state. The method 500 provides an indication of the quality of the material employed with and the fabrication process of ferroelectric memory devices. FIG. 6A depicts a logical 0 as "0", a logical 1 as "1", same state as SS, opposite state as OS, a positive state as "P", a negative state as "N", and an unchanged state as "U".

As stated above, ferroelectric capacitors are written by applying a positive pulse to write a logical 0 and by applying a negative pulse to write a logical 1. As discussed previously, reading ferroelectric capacitors can be destructive. Read operations are performed by applying a positive pulse to the plate line of the capacitor and interrogating the capacitor by coupling the other plate to a bit line. The correct, stored value is obtained by the positive pulse and leaves the capacitor in a positive state even if it was previously in a negative state (e.g., storing a 1), which in such cases results in a destructive read operation.

An initialization sequence can be performed wherein a time zero read for each capacitor is taken prior to baking the capacitors after the initial write operation performed at 502. A delay of a selected time period is performed after the initial write and then the time zero read is obtained. The exemplary run 600 begins at 502 where a positive pulse, which corresponds to a logical 0, is written to CAP A and a negative pulse, which corresponds to a logical 1, is written to CAP B. As a result, CAP A is now in a positive state and CAP B is in a negative state. CAP A and CAP B are then baked at a selected temperature for a selected time (e.g., 150 degrees Celsius for 24 hours) at 504. A read operation is performed at 506 by applying a positive pulse and interrogating the capacitors as discussed above. CAP A reads a logical 0 and CAP B correctly reads a logical 1. CAP A remains un-switched and in a positive state but CAP B, because of the positive read pulse, is now in a positive state. These reads illustrate same state retention and generally applies even at relatively high temperatures. Since it is known what data was written to the cells, by comparing the expected data to actual data, same state data errors in the cells may be ascertained. Additionally, a same state signal margin, which is the polarization difference between the two reads from CAP A and CAP B, is also obtained.

To simulate normal memory operation, a re-write is performed on CAP A and CAP B at 508 wherein the read values, logical 0 and logical 1, are written to CAP A and CAP B, respectively. As discussed above, the destructive nature of the read operation requires that read data be re-written during normal cell operation. CAP A is provided with a positive pulse and CAP B is provided with a negative pulse, as illustrated.

Opposite states are then written to CAP A and CAP B such that each capacitor is written to a state opposite that with which it was previously written and baked at, at 510. Thus, a negative pulse is applied to CAP A causing CAP A to be at a negative state and a positive pulse is applied to CAP B causing CAP B to be at a positive state. A delay for a selected amount of time is performed at 512 to allow the capacitors to reach steady state. Generally, a delay of 5–30 seconds is used although steady state is typically reached within milliseconds (e.g., 10–100 milliseconds).

Continuing at 514, an opposite state read is performed. CAP A should read as a logical 1 and CAP B should read as a logical 0. Again, since the written data is known, the read data can be compared to the expected (written) data to determine whether any opposite state errors occurred. Similar to the same state signal margin, an opposite state signal margin, the polarization difference between the two reads, is obtained for CAP A and CAP B. The read data is re-written at 516. Then, another run or execution of the method 500 can be performed by writing the initial, same state values to CAP A and CAP B at 502 again.

In accordance with the present invention, the inventors discovered that by writing data to each of the ferroelectric memory cells and then baking such programmed cells, the data retention lifetimes associated therewith are substantially improved. The following figures illustrate several pieces of data collected on various FRAM devices under differing conditions, and such data illustrates the above benefits as measured by retained signal margin after lifetime testing in a manner similar to that highlighted in FIG. 6.

As a brief summary, it was found that a pre-bake in either a "1" state or a "0" state (each cell programmed to that state) resulted in a hysteresis loop shift that resulted in beneficial improvements in data retention lifetime for the cells. Further, for the FRAM cells employed (as will be discussed in greater detail infra), the "1" state program pre-bake provided better data retention lifetime improvements over the "0" state program, although in either case, significant improvement was obtained over conventional devices employing no programming and pre-bake.

Figure 7:
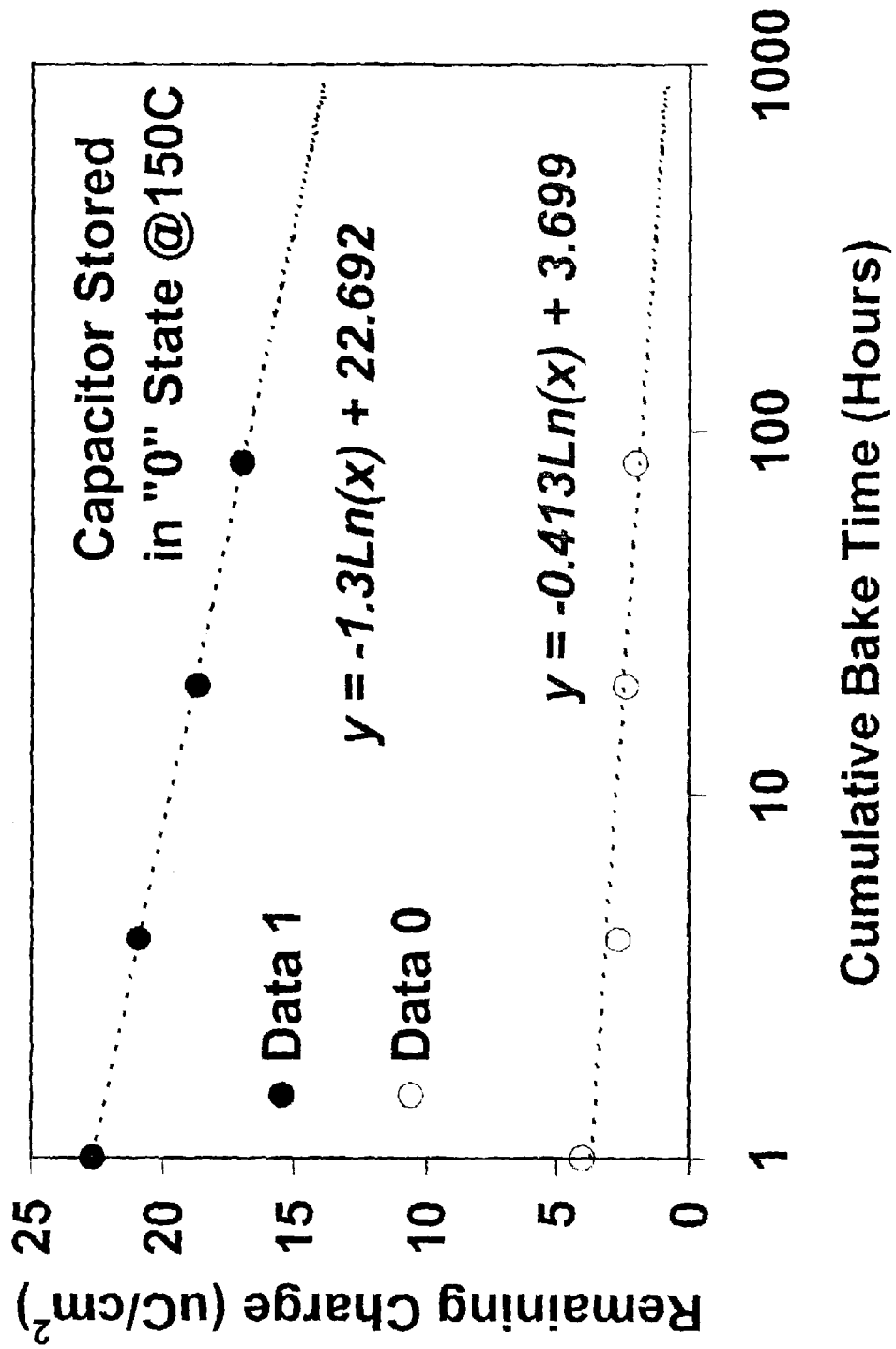
FIG. 7 is a graph illustrating exemplary results of baking a ferroelectric capacitor in a "0" state in accordance with an aspect of the present invention.
Figure 8:
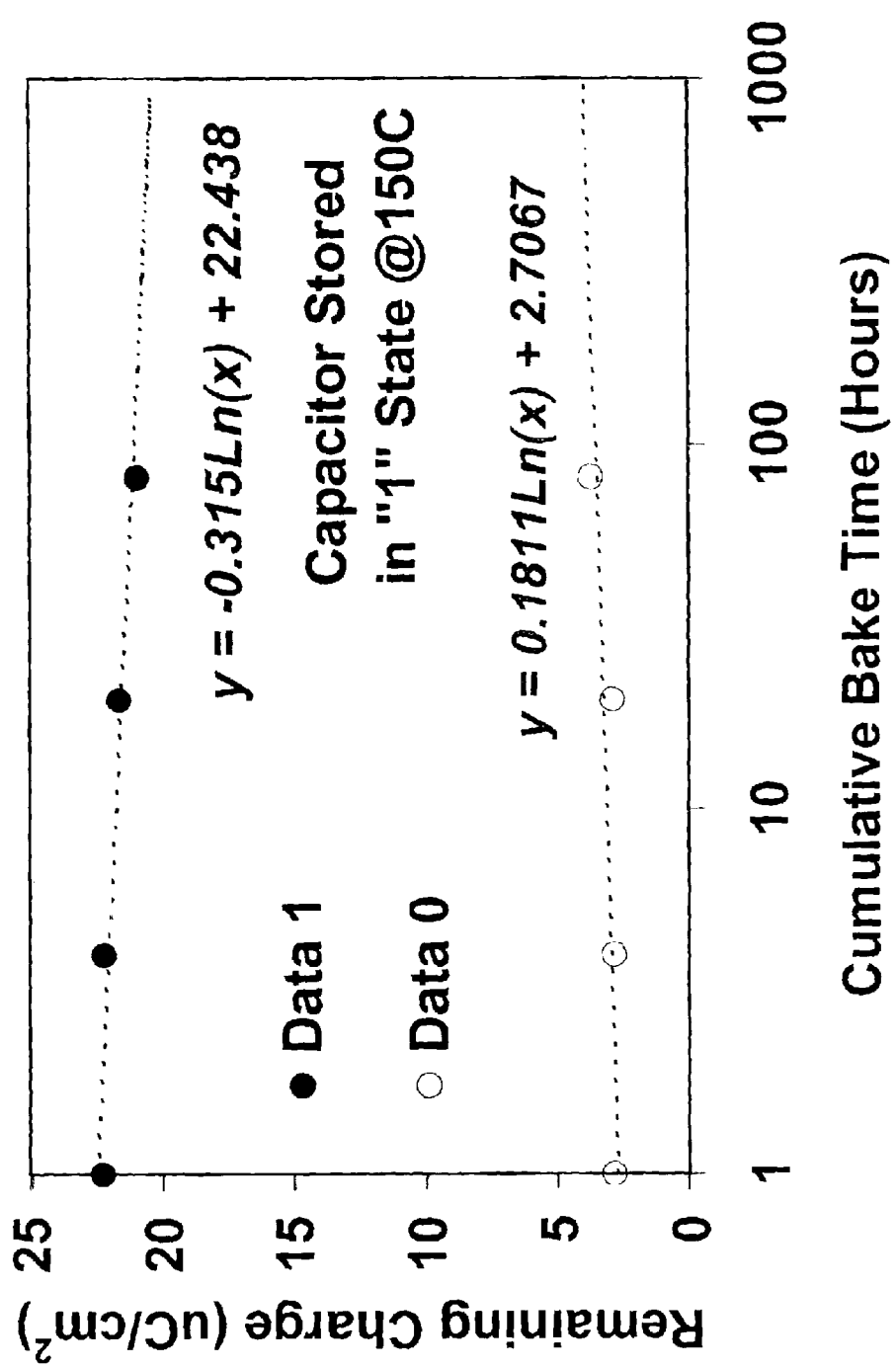
FIG. 8 is a graph illustrating exemplary results of baking a ferroelectric capacitor in a "1" state in accordance with an aspect of the present invention.

FIGS. 7–11 serve to illustrate the effects of imprint and data retention lifetimes as well as improvements in data retention as appreciated by the inventors of the present invention and that can be obtained by the present invention. FIGS. 7 and 8 illustrate exemplary test results for a 1.3 volt symmetric retention test. FIG. 7 is a graph that illustrates the impact of baking or imprinting a ferroelectric capacitor in the logical 0 state (positive) and obtaining remaining charge for Data 0 and Data 1 states over time. A y axis depicts remaining charge measured on the ferroelectric capacitor and the x axis depicts cumulative bake time (i.e., the bake time accumulated over a number of cycles or repetitions of the lifetime test). The ferroelectric capacitor in the above example was baked at 150 degrees Celsius. Generally, data retention is lost or the device fails when the difference in charge between positive and negative states of the ferroelectric capacitor becomes too small.

It is noted that charge values in the logical 0 state change slowly over time according to the equation:

$$y=-0.413Ln(x)+3.699 \quad (1)$$

However, the charge values for the logical 1 state degrade more rapidly because the capacitor was baked or imprinted in the "0" state:

$$y=-1.3Ln(x)+22.692 \quad (2)$$

As a result, the difference or signal margin between the "0" state and the "1" state shrinks over time. The remaining charge for the Data 0 state decreases and moves "away" from the Data 1 state over time, which is desirable. Thus, data retention for the logical 0 state improves over time. However, the remaining charge for the Data 1 state also decreases and moves "toward" the Data 0, but decreases more rapidly than the Data 0 state thereby reducing data retention (in the logical 1 state) over time.

Continuing on, FIG. 8 is a graph that illustrates the impact of baking a ferroelectric capacitor in the logical 1 state (negative) and obtaining remaining charge for Data 0 and Data 1 states over time. A y axis depicts remaining charge measured on the ferroelectric capacitor and the x axis depicts cumulative bake time (i.e., the bake time accumulated over a number of cycles or repetitions of the lifetime test). This ferroelectric capacitor was also baked at 150 degrees Celsius.

It is noted that charge values in the logical 1 state change more slowly over time as compared with FIG. 7 and change according to the equation:

$$y=-0.315Ln(x)+22.438 \quad (3)$$

And, as expected, the charge values for the logical 0 state degrade more rapidly because the capacitor was baked or imprinted in the "1" state:

$$y=0.1811Ln(x)+2.7067 \quad (4)$$

The remaining charge for the Data 0 state increases and moves "toward" the Data 1 state over time, which is undesirable. Thus, the data retention for the logical 0 state decreases over time. The remaining charge for the Data 1 state decreases over time and also moves "toward" the data 0 state. However, the rate at which the remaining charge for the Data 1 state decreases is substantially less than that of FIG. 7 wherein the capacitor is pre-baked in the logical 0 state.

It can be seen from FIGS. 7 and 8 that degradation due to a "0" state bake is more severe than degradation due to a "1" state bake (a negative slope of 1.3 versus 0.18 for the Data 1 state). Additionally, it is appreciated that the procedures described in FIGS. 7 and 8 can be employed to analyze data retention for each capacitor individually.

Figure 9:
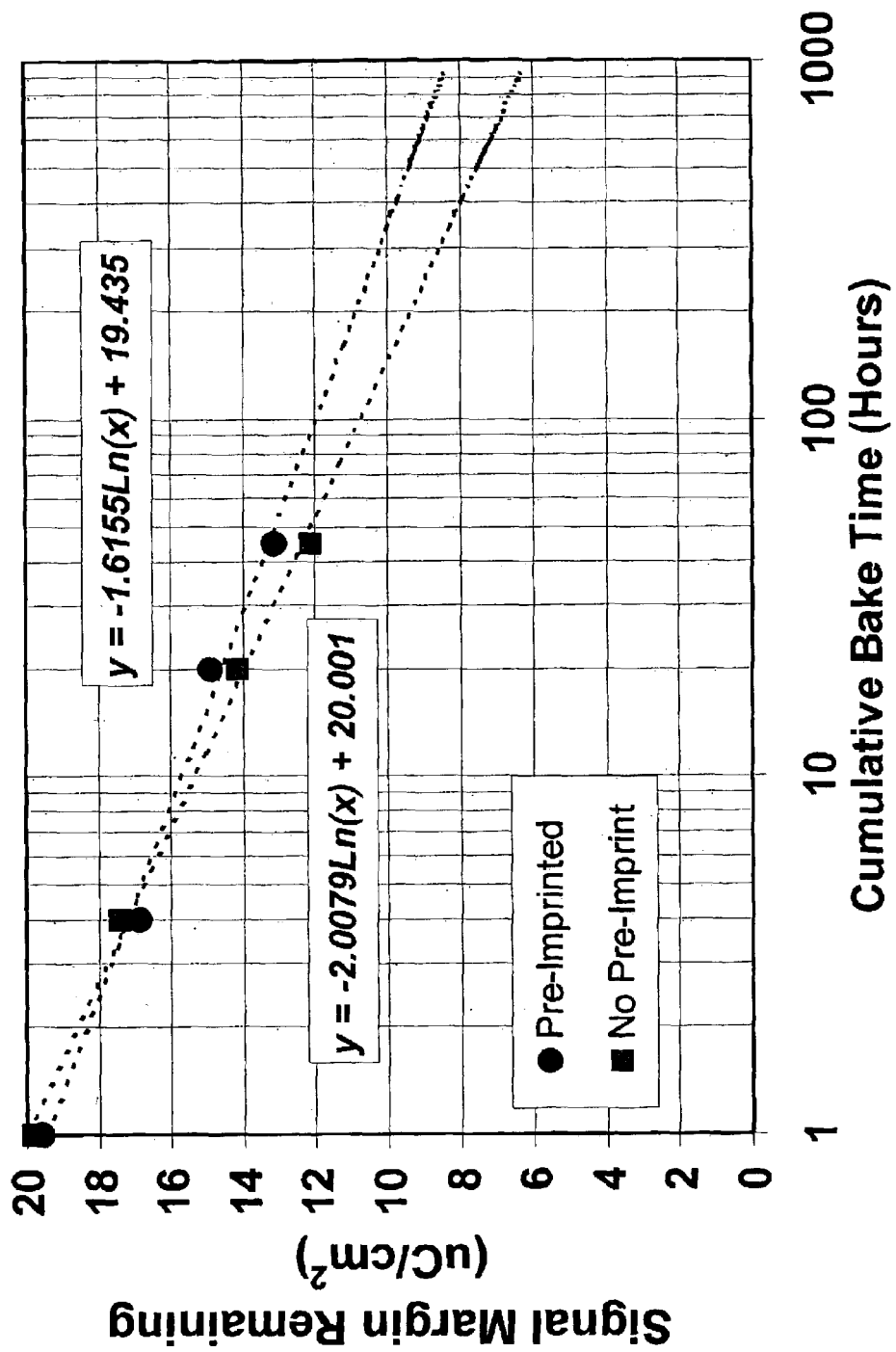
FIG. 9 is a graph illustrating data retention for a non-imprinted ferroelectric memory device and an imprinted ferroelectric memory device in accordance with an aspect of the present invention.

FIG. 9 is a graph that illustrates data retention for a non-imprinted ferroelectric memory cell and an imprinted ferroelectric memory cell in accordance with the present invention. The imprinted memory cell has been programmed to a "1" state and baked for 2 hours at 150 degrees Celsius. A y axis depicts remaining signal margin and the x axis depicts cumulative bake time (i.e., the bake time accumulated over a number of cycles or repetitions of the lifetime test).

The non-imprinted memory cell degrades at a rate defined by the equation:

$$y=-2.0079Ln(x)+20.001 \quad (5)$$

The imprinted memory cell degrades more slowly and is estimated by the equation:

$$y=-1.6155Ln(x)+19.435 \quad (6)$$

As a result, it can be seen that the imprinted memory cell degrades more slowly with respect to remaining signal margin than the non-imprinted memory cell. Thus, where a signal margin of less than about 10 $\mu C/cm^2$ indicates a failure in this example, the imprinted ferroelectric memory cell yields about a 2× improvement in time till failure.

Figure 10:
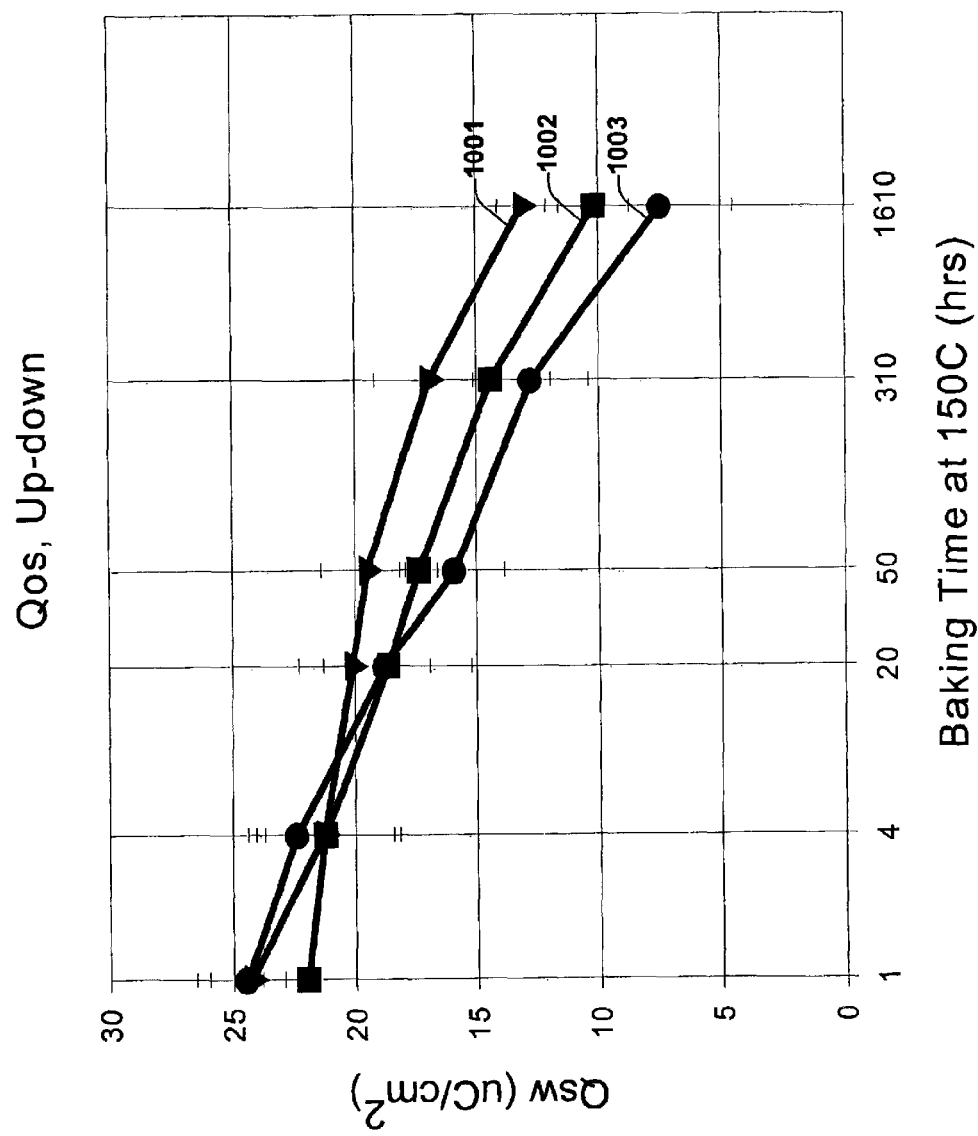
FIG. 10 is a graph illustrating data retention capabilities for ferroelectric memory devices in accordance with an aspect of the present invention.

FIG. 10 is a graph that illustrates data retention capabilities for ferroelectric memory cells in accordance with the present invention. A y axis depicts signal margin remaining and the x axis depicts cumulative bake time (i.e., the bake time accumulated over a number of cycles or repetitions of the lifetime test).

A ferroelectric memory cell imprinted in a "1" state is represented by line 1001, a ferroelectric memory cell imprinted in a "0" state is represented by line 1002, and a non-imprinted ferroelectric memory cell is represented by line 1003. Accordingly, it can be seen that over time the non-imprinted cell's signal margin and, therefore, data retention degrades more quickly than the imprinted memory cells. Additionally, the ferroelectric memory cell imprinted in the "1" state degrades less slowly than both the non-imprinted memory cell and the memory cell imprinted in the "0" state. Also, the memory cell imprinted in the "0" state remains superior with respect to signal margin when compared with the non-imprinted ferroelectric memory cell. Thus, where a signal margin of less than about 10 $\mu C/cm^2$ indicates a failure in this example, the imprinted (in the "1" state) ferroelectric memory cell yields about a 5× improvement in time till failure as compared with the non-imprinted cell. The memory cells were imprinted at 150 degrees Celsius.

Figure 11:
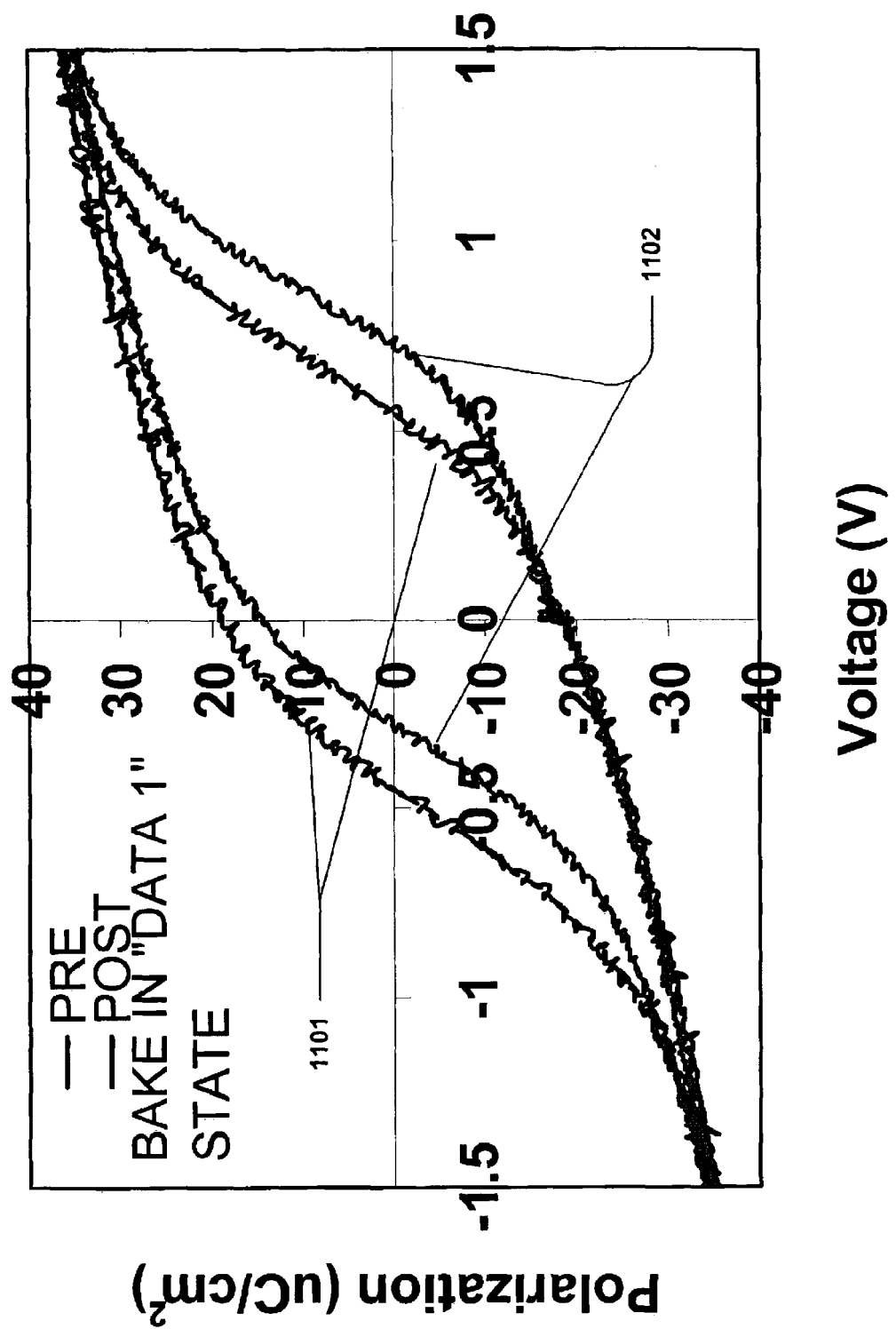
FIG. 11 is a graph illustrating temperature shifting of a ferroelectric memory cell imprinted in a "0" state in accordance with an aspect of the present invention.

FIG. 11 is a graph that illustrates shifting of a ferroelectric memory cell imprinted in a "1" state in accordance with an aspect of the present invention. The graph illustrates the charge "Q" (Y-axis), and the voltage "V" (X-axis). Line 1501 indicates measurements obtained for the hysteresis loop prior to baking and line 1502 indicates measurements for the hysteresis loop after life testing for 102 hours at 150 degrees Celsius.

Figure 12:
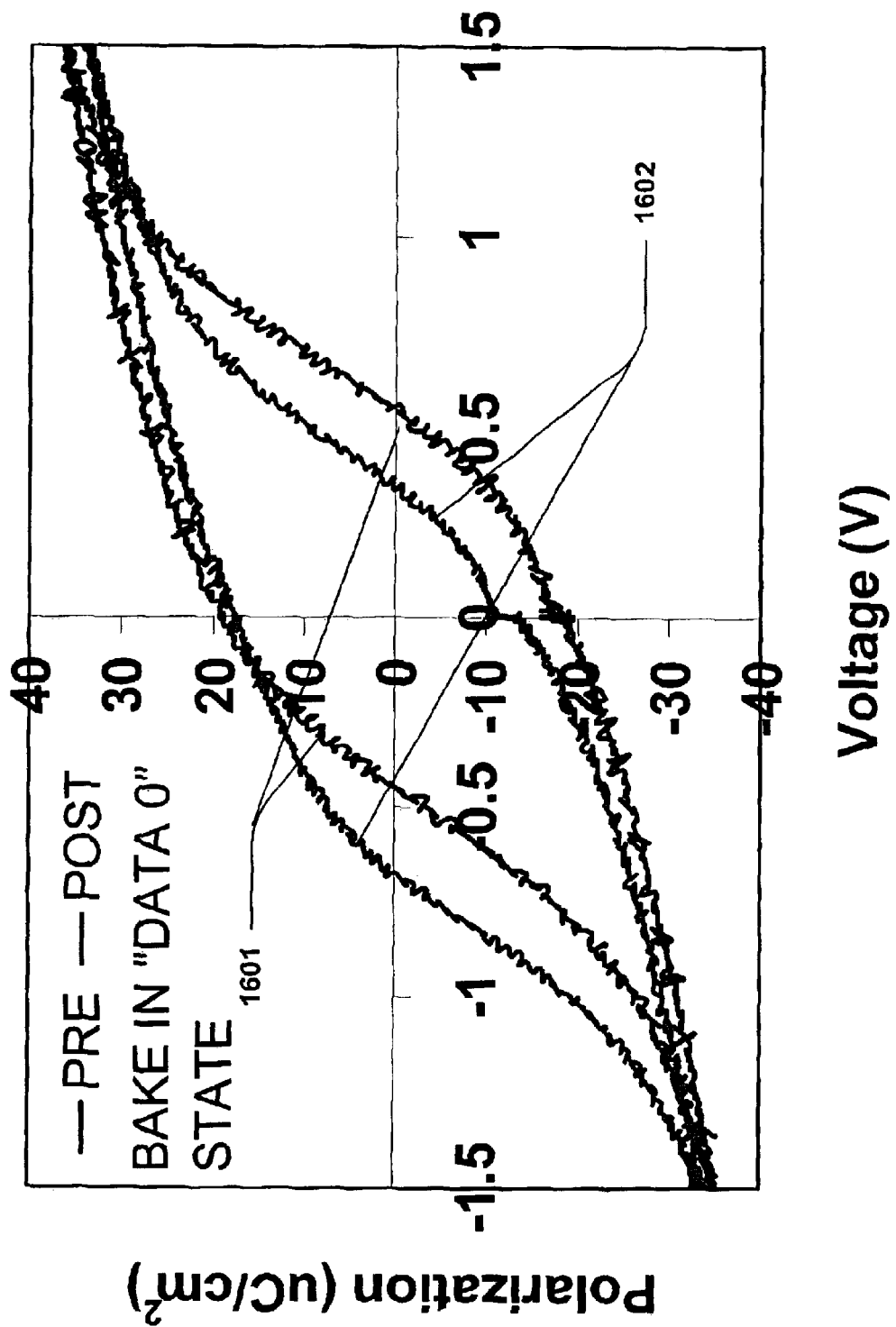
FIG. 12 is a graph illustrating temperature shifting of a ferroelectric memory cell imprinted in a "1" state in accordance with an aspect of the present invention.

FIG. 12 is a graph that illustrates shifting of a ferroelectric memory cell imprinted in a "0" state in accordance with an aspect of the present invention. The graph illustrates the charge "Q" (Y-axis), and the voltage "V" (X-axis). Line 1601 indicates measurements obtained for the hysteresis loop prior to baking and line 1602 indicates measurements for the hysteresis loop after life testing for 102 hours at 150 degrees Celsius.

It can be seen from FIGS. 11 and 12 that the hysteresis loop shifts more for the ferroelectric memory cell imprinted and baked in the "0" state than the ferroelectric memory cell imprinted and baked in the "1" state.

In view of the foregoing structural and functional features described supra, methodologies in accordance with various aspects of the present invention will be better appreciated with reference to FIGS. 13–16. While, for purposes of simplicity of explanation, the methodologies of FIGS. 13–16 are depicted and described as executing serially, it is to be understood and appreciated that the present invention is not limited by the illustrated order, as some aspects could, in accordance with the present invention, occur in different orders and/or concurrently with other aspects from that depicted and described herein. Moreover, not all illustrated features may be required to implement a methodology in accordance with an aspect the present invention.

The discussion above illustrates that data retention lifetimes can be modified and/or improved by baking a ferroelectric device into a particular or selected state as part of the fabrication process. The methods depicted below serve to illustrate some mechanisms and procedures that make use of this improvement/modification of data retention lifetimes in accordance with the present invention in order to obtain ferroelectric memory devices having suitable or desirable data retention lifetimes.

Figure 13:
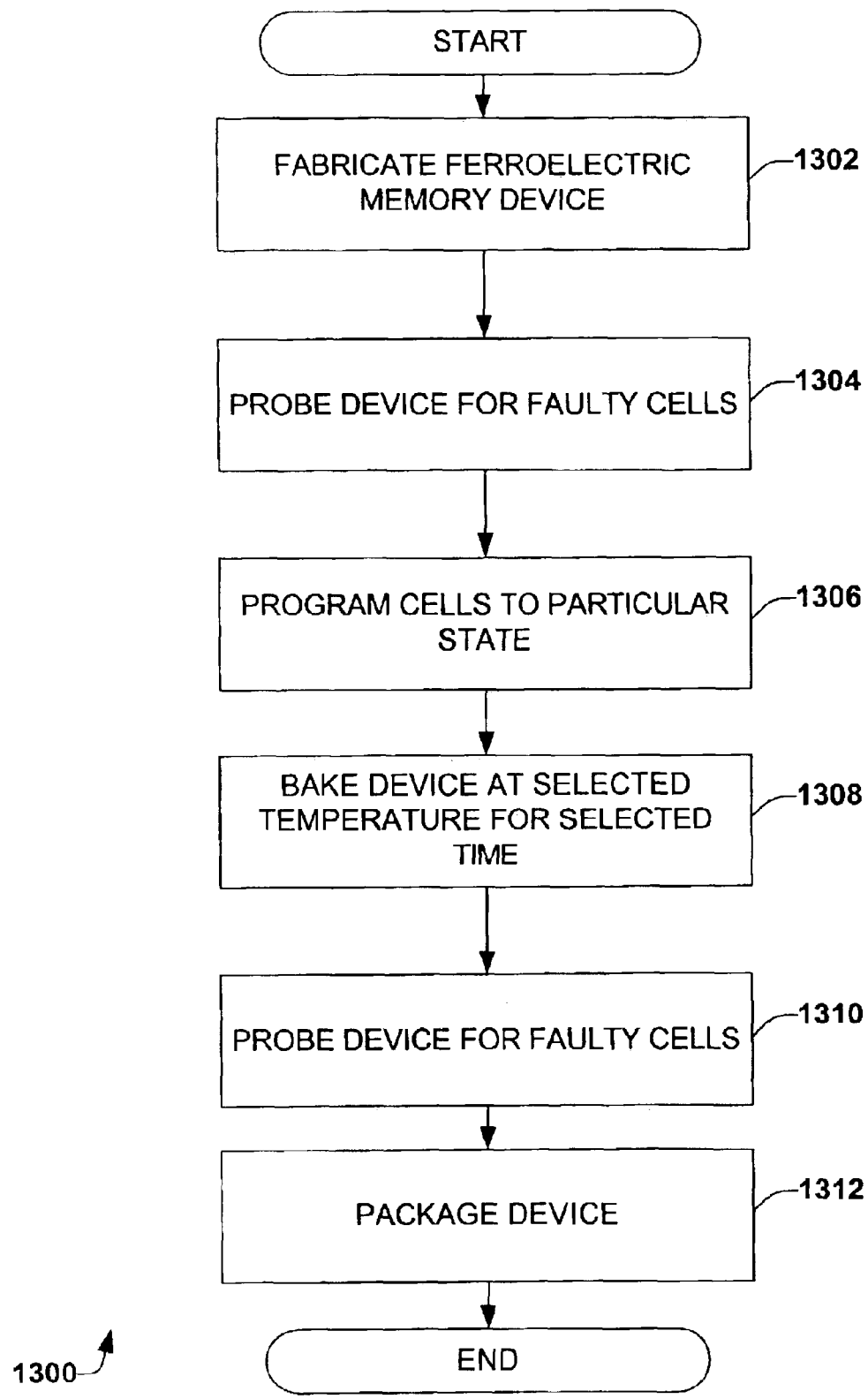
FIG. 13 is a flow diagram illustrating a method of fabricating a ferroelectric memory device in accordance with an aspect of the present invention.

FIG. 13 is a flow diagram illustrating a method 1300 of fabricating a ferroelectric memory device in accordance with an aspect of the present invention. The method 1300 programs cells of a device to a selected state and then bakes the device in order to extend or improve data retention lifetime of the device.

The method 1300 begins at 1302 where a ferroelectric memory device is fabricated by suitable processing methods. The ferroelectric memory device comprises arrays of ferroelectric memory cells containing ferroelectric capacitors that have a hysteresis property associated with ferroelectric devices, such as described with respect to FIG. 4. The memory cells are probed to identify failed or faulty cells at 1304. Generally, patterns of data are written to the memory cells, read back, and then compared to identify failures or discrepancies. This cycle is repeated with other patterns of data a number of times. Appropriate re-write operations are also performed to simulate normal operation.

The memory cells are programmed to a particular state at 1306, which is positive or negative. The particular state employed can vary by implementation. The inventors of the present invention have noted that programming to a negative state tends to yield superior data retention lifetimes as compared to programming to a positive state. However, it is appreciated that different conditions and materials could result in the positive state yielding superior data retention lifetimes.

The memory device is baked at a selected temperature for a selected amount of time at 1308. The suitable selected temperature is generally in the range of greater than about 105 degrees Celsius and less than about 250 degrees Celsius and the selected time is typically less than about 24 hours. Yet, it is appreciated that any temperature and time can be employed so long as it does not result in significant or substantial damage to the memory device.

Optionally, the memory cells are again probed at 1310 typically in a manner similar to that used at 1306 in order to determine or detect possible damage incurred during the previous programming and baking. Subsequently, the memory device is packaged at 1312.

Figure 14:
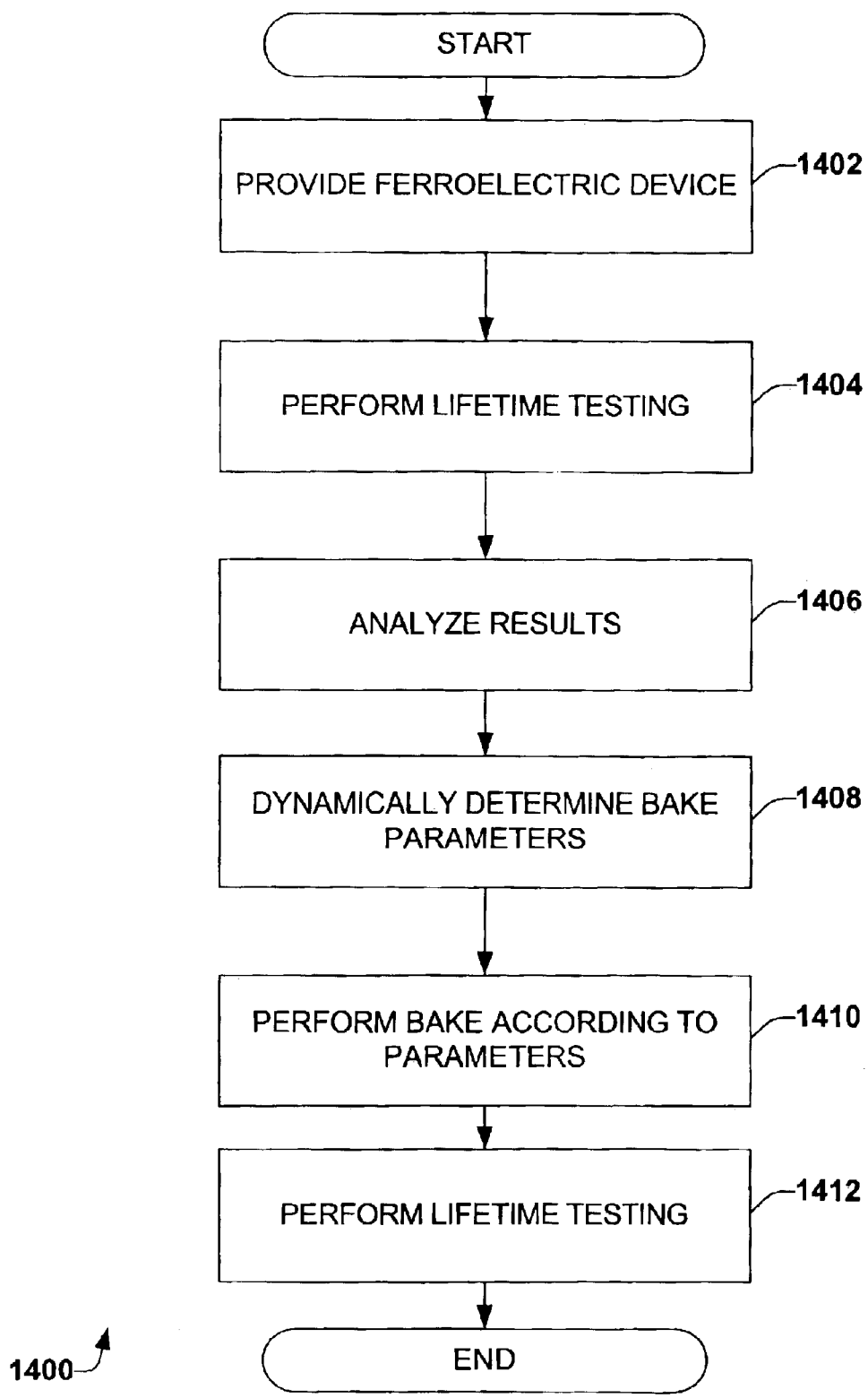
FIG. 14 is a flow diagram illustrating another method of fabricating a ferroelectric memory device in accordance with another aspect of the present invention.

FIG. 14 is a flow diagram illustrating a method 1400 of fabricating a ferroelectric memory device in accordance with an aspect of the present invention. The method 1400 can identify data retention lifetime shortcomings and improve the data retention lifetime by selectively programming and baking the device as described below.

The method 1400 begins at 1402 where a fabricated ferroelectric memory device is provided. Simulated data retention lifetime testing is performed at 1404. A suitable method, such as method 500 of FIG. 5 and variations thereof, is employed to perform the data retention lifetime testing. The obtained results are analyzed to determine if the memory device meets a suitable lifetime threshold (e.g., 10 years at 145 degrees Celsius) at 1406.

The obtained results are analyzed at 1408 to dynamically determine bake parameters, including but not limited to, time and temperature that can/should cause the memory device to meet the suitable lifetime threshold. Subsequently, the memory device is baked at 1410 according to the determined bake parameters (e.g., determined time and temperature).

Simulated data retention lifetime testing is again performed at 1412 in a manner similar to that employed at 1404. If the memory device now meets the lifetime threshold, the device can pass to a packaging procedure. Otherwise, an additional bake procedure can be performed in order to attempt to improve the data retention lifetime.

Figure 15:
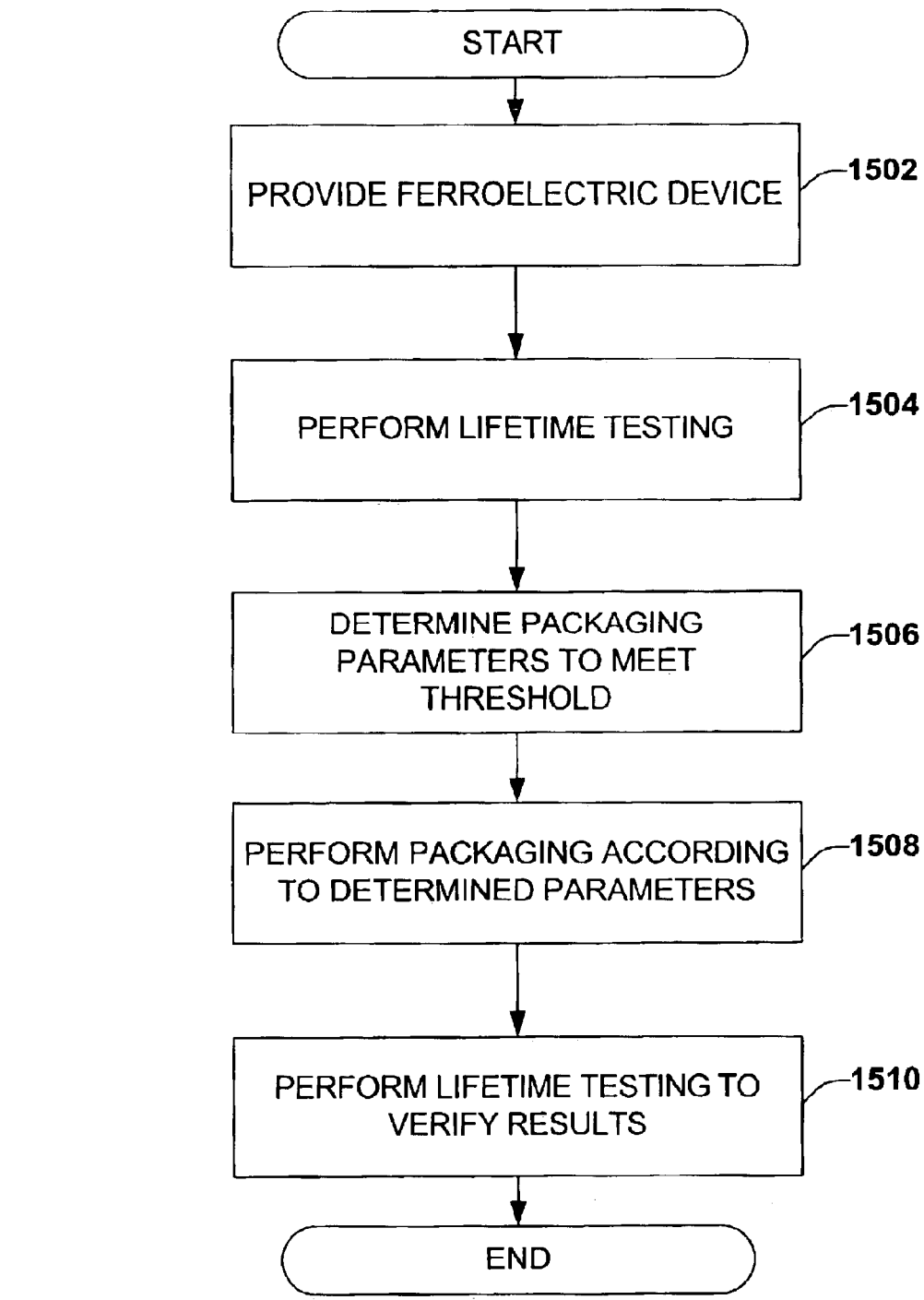
FIG. 15 is a flow diagram illustrating a method of fabricating a ferroelectric memory device in accordance with another aspect of the present invention.

FIG. 15 is a flow diagram illustrating a method 1500 of fabricating a ferroelectric memory device in accordance with an aspect of the present invention. The method 1500 adjusts length of time and temperature employed in packaging in order to achieve a suitable data retention lifetime for the memory device. Generally, packaging procedures employ relatively high temperatures (e.g., greater than 200 degrees Celsius) for short periods of time. The method 1500 modifies the time and temperature so as to improve the data retention lifetime during packaging without significantly or substantially damaging the memory device.

The method 1500 begins at 1502 where a fabricated ferroelectric memory device is provided. A suitable simulated data retention lifetime test, such as described supra, is performed at 1504. The obtained results are analyzed at 1506 to determine packaging parameters, including but not limited to time and temperature that can cause the memory device to meet the suitable lifetime threshold.

A packaging operation is performed at 1508 according to the determined packaging parameters. The parameters include the length of time at which the device is maintained at the temperature so as to selectively improve the data retention lifetime of the memory device. Then, verification lifetime testing is performed at 1510 in order to verify that/if the ferroelectric memory device meets the suitable data retention lifetime threshold.

Figure 16:
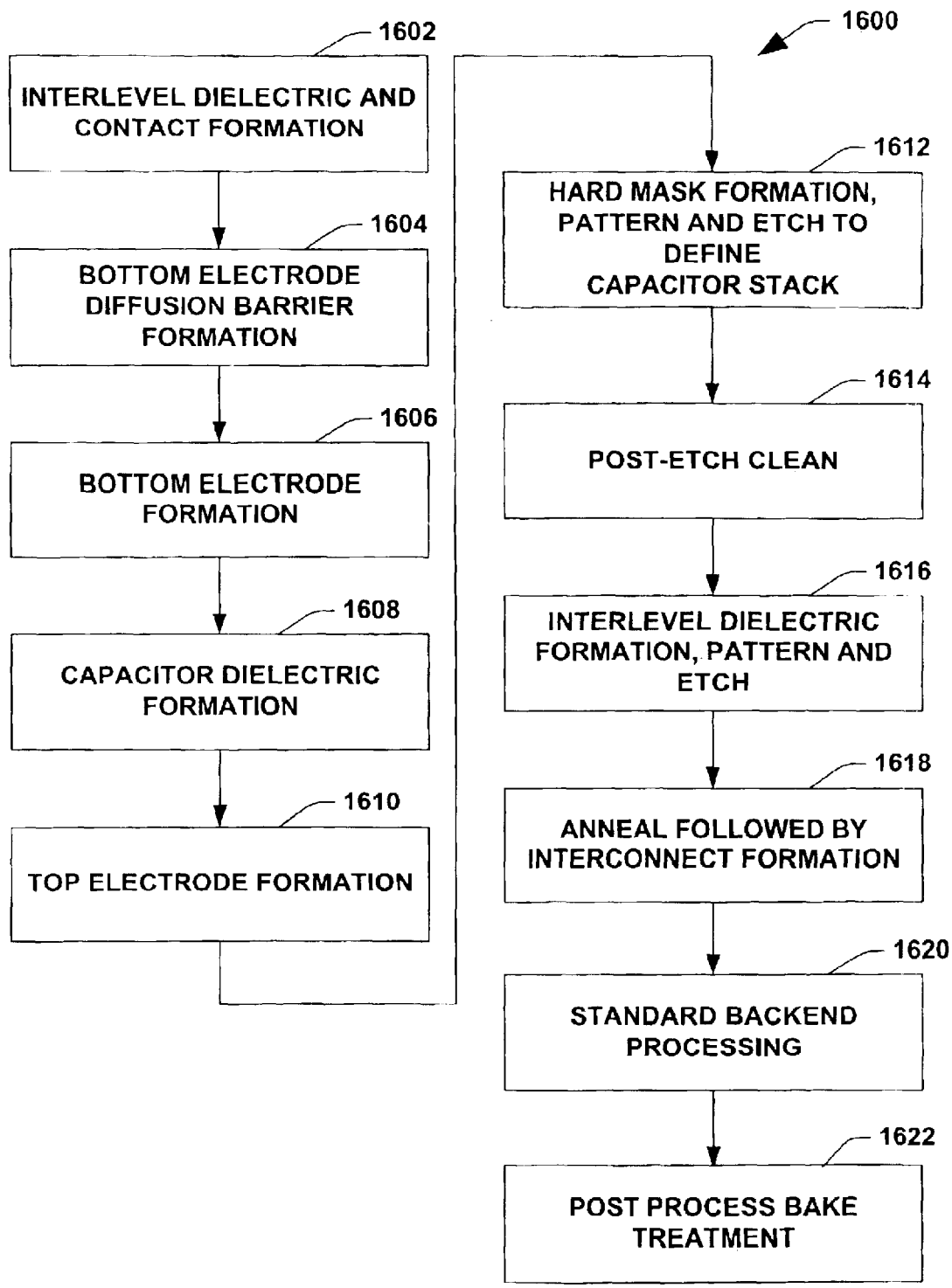
FIG. 16 is a flow diagram illustrating a method of fabricating a ferroelectric memory device in accordance with another aspect of the present invention.

Turning now to FIG. 16, a flow diagram illustrating a method 1600 of forming a semiconductor device having a ferroelectric capacitor in accordance with an aspect of the present invention. The method 1600 operates on a device that has undergone standard front end processing.

Beginning at block 1602, an interlevel dielectric layer is formed and conductive contacts (e.g., tungsten (W) contacts) are formed therein with a barrier layer (e.g., TiN) disposed therebetween to avoid oxidation of the tungsten contacts. Formation of the interlayer dielectric and the contacts may be formed by various means and any such process is contemplated as falling within the scope of the present invention. Subsequently, the FRAM capacitor(s) are formed over the interlayer dielectric and the contacts.

A bottom electrode diffusion barrier layer is formed over the interlevel dielectric and the contact(s) at block 1604. The bottom electrode diffusion layer is comprised of a suitable material and is formed so as to have a low resistivity. Some exemplary materials suitable for the bottom electrode diffusion barrier layer include, TiAlON, TaSiN, TiSiN, TaAlN, Ti, TiN, Ta, TaN, HfN, ZrN, HfAlN, CrN, TaAlN, CrAlN, and the like. A suitable deposition technique for the bottom electrode diffusion barrier layer include reactive sputter deposition using $Ar+N_2$ or $Ar+NH_3$. Other deposition techniques that might be used include CVD or plasma enhanced CVD.

It is appreciated that a cleaning operation can be performed prior to formation of the bottom electrode diffusion barrier layer. For example, one option is to sputter clean with Ar prior to the deposition of the bottom electrode diffusion barrier layer. This pre-clean occur without a vacuum break prior to the deposition of the barrier.

A bottom electrode is formed over the bottom electrode diffusion barrier layer at block 1606. This layer should remain stable during subsequent processing and formation of the ferroelectric dielectric layer. For example, with a PZT ferroelectric, reliability is improved with oxide electrodes. The electrode experiences the thermal budget and oxidizing conditions of the ferroelectric deposition and possibly anneal. Therefore the bottom electrode is desirably stable in oxygen and does not form insulating layers as a result of such oxygen. It is also advantageous that the bottom electrode at least partially impedes the oxidation and reaction of the underlying diffusion barrier.

In addition, the bottom electrode preferably maintains a relatively low contact resistance. A list of possible materials includes Pt, Pd, PdOx, IrPt alloys, Au, Ru, $RuO_x$, (Ba,Sr,Pb)$RuO_3$, (Sr,Ba,Pb)$IrO_3$, Rh, $RhO_x$, $LaSrCoO_3$, (Ba,Sr)$RuO_3$, $LaNiO_3$.

The bottom electrode can be formed via a number of suitable techniques. For example, the bottom electrode can be formed by a putter deposition for Ir (Ar) and/or reactive sputter deposition ($Ar+O_2$) for IrOx, which work well with PZT ferroelectric materials.

A ferroelectric dielectric layer is formed on the bottom electrode at block 1608. The ferroelectric dielectric layer is comprised of a ferroelectric material such as $Pb(Zr,Ti)O_3$ PZT (lead zirconate titanate), doped PZT with donors (Nb, La, Ta) acceptors (Mn, Co, Fe, Ni, Al) and/or both, PZT doped and alloyed with $SrTiO_3$, $BaTiO_3$ or $CaTiO_3$, strontium bismuth tantalate (SBT) and other layered perovskites such as strontium bismuth niobate tantalate (SBNT) or bismuth titanate, $BaTiO_3$, $PbTiO_3$, $Bi_2TiO_3$ etc. PZT is frequently chosen the capacitor dielectric because it has the highest polarization and the lowest processing temperature of the aforementioned materials. Thin PZT (<100 nm) is extremely advantageous in making integration more simple (less material to etch) and less expensive (less material to deposit therefore less precursor). Because PZT has the largest switched polarization, it is also possible to minimize capacitor area using such material.

The ferroelectric dielectric layer can be formed by a deposition process such as metal organic chemical vapor deposition (MOCVD), MOCVD is preferred especially for thin films (<100 nm). MOCVD also permits the film thickness to be scaled without significant degradation of switched polarization and coercive field, yielding PZT films with a low operating voltage and large polarization values. In addition, the reliability of the MOCVD PZT film is better than that generally obtained using other deposition techniques, particularly with respect to imprint/retention.

Continuing at block 1610, a top electrode is formed over the ferroelectric dielectric layer. The top electrode can be comprised of one or more individual layers. The top electrode can be comprised of materials similar to those employed for the bottom electrode. Some suitable materials for the top electrode include, iridium oxide and iridium.

In particular it is advantageous for Pb based ferroelectrics to have a conductive oxide top electrode such as $IrO_x$, $RuO_x$, $RhO_x$, $PdO_x$, $PtO_x$, $AgO_x$, (Ba,Sr)$RuO_3$, $LaSrCoO_3$, $LaNiO_3$, $YBa_2Cu_3O_{7-x}$ rather than a noble metal in order to minimize degradation due to many opposite state write/read operations (fatigue). Many of the Bi ferroelectrics such as SBT can also use noble metal electrodes such as Pt, Pd, Au, Ag, Ir, Rh, and Ru and still retain good fatigue characteristics.

If the top electrode is an oxide, it is generally advantageous to have a noble metal layer above it in order to maintain low contact resistance between the top metal contact and oxide. For example, it is possible that a TiN in contact with IrOx might form $TiO_2$ during subsequent thermal processes, which is insulating. For any electrode using an expensive noble metal such as Pt, Ru, Pd, or Ir it is advantageous from a cost and integration standpoint to use as thin of layer as possible. The top electrode can be formed via a variety of suitable deposition processes, such as a physical vapor deposition process.

At block 1612, a hard mask is formed followed by a patterning process that defines a capacitor stack. The hard mask is comprised of a suitable material that is resistant to developer such as silicon dioxide or a silicon rich material and retains its integrity during the capacitor stack etch process. The hard mask is formed so as to be thick enough to facilitate patterning of the deposited layers to form the capacitor stack.

Continuing at block 1614, a post patterning process is performed to remove unwanted remnants of the patterning process (e.g., developer, resist, and the like). The pattern and etch processes can introduce contaminants to the capacitor stack and the semiconductor device. After a patterning process, it is likely that the etch tool and the front side, edge and backside of the wafers will have FRAM contamination or have etch residues with FRAM contamination. It is therefore desirable to clean the front side of the wafer and chemically remove etch residues and possibly remove a thin layer of damaged PZT. This post capacitor etch wet clean can, with some etch conditions and chemistries, be as simple as a Dl water clean (tank soak with or without megasonic followed by a spin rinse dry) or the tank etch might be acid based in order to improve the clean or remove more damage. One exemplary acid solution might be similar to SC1 or SC2 (possibly without peroxide but maybe with ozone), for example ($NH_4F+O_3+H_2O$ or $NH_4F+H_2O_2+HCl+H_2O$: 1/1/1/300) in order to also assist in particle removal plus metal contamination removal).

The backside and edges of the wafer can be significantly contaminated by re-deposition of FRAM elements. The contamination is preferably removed prior to process in a shared tool. One method to remove the backside chemistry is to use a specialized tool such as a backside clean tool (e.g., as made by SEZ). Even hard to etch materials such as Ir can be removed if they are sub monolayer coverage by undercutting the etching of the material on the backside. Other suitable solutions and/or methods can be employed to remove unwanted remnants of the patterning process and still be in accordance with the present invention. A sidewall diffusion barrier layer is generally formed that encapsulates the capacitor stack.

At block 1616, an interlevel dielectric layer is deposited and/or formed over the device and vias are formed in the interlevel dielectric layer to provide electrical connections to the top electrode and other contacts. The interlevel dielectric layer is comprised of a suitable materials, such as, $SiO_2$, FSG, PSG, BPSG, PETEOS, HDP oxide, a silicon nitride, silicon oxynitride, silicon carbide, silicon carbo-oxy-nitride, a low dielectric constant material (preferably SiLK, porous SILK, teflon, low-K polymer (possibly porous), aerogel, xerogel, BLACK DIAMOND, HSQ, or any other porous glass material), or a combination or stack thereof. The interlevel dielectric layer can then be planarized (e.g., chemical mechanical planarization).

After the interlevel dielectric layer is formed, vias are formed to make electrical connection to the top electrode and to the contacts. Standard semiconductor processing techniques can be utilized to form the vias. The vias are formed without etching a significant amount of the underlying material (W, TiN and $SiO_2$ at the contacts) and hard mask etch stop layer (TiAlON or TiON) on top of the capacitors under a few preferred embodiments. SiN etch processes with these characteristics have been developed and the etch selectivity to TiAlON has been documented to be very good. This result is useful since the SiN etch rate on the capacitor is expected to faster and the SiN is also expected to be thinner compared to at the contacts which is deeper.

An anneal process is performed followed by interconnect formation at block 1618 so as to remove damage introduced by the capacitor stack processing (such as the ferroelectric material etch, encapsulation, and contact etch) into the capacitor dielectric and to improve the electrical properties of these features. If this anneal is not done at this point (i.e. if the anneal is done with the PZT stack exposed on its sidewalls), then it may result in the loss of Pb near the perimeter of each capacitor. This loss in Pb in the PZT film will result in the degradation of the electrical properties of small capacitors (capacitors with large perimeter to area ratios) after the capacitor integration.

The anneal of the instant invention is, generally, performed after the interlevel dielectric is formed and the via holes patterned and etched, but prior to the filling of the vias with the conductive material. After this anneal is performed, the via diffusion barrier (liner) and conductor are formed using standard semiconductor processing techniques. The conductor is either W with TiN diffusion barrier or more preferably Cu with TaN, TaSiN, Ta, TiN, WN, or TiSiN diffusion barrier deposited by enhanced sputter deposition or more preferably CVD. The Cu is deposited by first depositing a Cu seed by enhanced sputter deposition or CVD preferably followed by Cu electroplating in order to fill the via. A standard semiconductor processing approach after the deposition of the metal in the via is to remove the metal on the top surface by etch back (W) or CMP (W and Cu). Another alternative is that metal layer above the via is formed using dual damascene process along with the via. The disadvantage of this approach results is a substantial increase in process complexity.

Standard back end processing can then be performed at 1620 to complete a process fabrication stage of the semiconductor device. After fabrication, a post-process blanket treatment of the memory device is performed at 1622, which includes programming the device to a particular state and baking the device at a selected temperature for a selected time period. The post process treatment facilitates data retention and may reduce the impact from defects in materials and fabrication of the ferroelectric memory device. It is noted that the electrode and ferroelectric capacitor material interface is generally asymmetric between top and bottom interfaces, which could lead to asymmetric retention behavior. The post-process blanket treatment could potentially overcome limitations on either electrode interface (top or bottom).

It is appreciated that variations of the method 1600 are contemplated and included in the present invention. For example, variations in process procedures, etching, depositing, and the like can occur and still be in accordance with the present invention.

FIGS. 13–16, described above, serve to illustratively provide methods of fabricating ferroelectric memory devices with modified data retention lifetimes in accordance with the present invention. Additionally, the inventors of the present invention note that other suitable mechanisms can be incorporated in accordance with the present invention to also modify data retention. Process development and modification can be performed to reduce defects that lead to loss of signal margin and data retention. Material selection and dopant selection can be adjusted to compensate for defects in processing or fabrication to reduce a rate of imprint or reduce establishing a preferential state. Architectures, such as 2T/2C can be employed that are less vulnerable to imprinting.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising."

What is claimed is:

1. A method of fabricating a ferroelectric memory device comprising:
    fabricating a ferroelectric memory device having arrays of memory cells via a number of suitable fabrication processes;
    determining a desired data retention lifetime for the memory cells of the ferroelectric memory device;
    selecting a time parameter and a temperature parameter according to the desired data retention lifetime;
    selecting a particular initial state according to the desired data retention lifetime;
    programming the memory cells of the ferroelectric memory device to be in the selected initial state; and
    performing a bake procedure on the ferroelectric memory device with the memory cells programmed to the selected initial state according to the selected time parameter and the selected temperature parameter.

2. The method of claim 1, wherein fabricating the ferroelectric memory device comprises fabricating a ferroelectric capacitor comprised of a bottom electrode, a top electrode, and a ferroelectric material in the respective memory cells.

3. The method of claim 2, wherein the ferroelectric material is Pb(Zr,Ti)O$_3$ (PZT).

4. The method of claim 1, wherein the determined data retention lifetime is 10 years of continuous use at 105 degrees Celsius.

5. The method of claim 1, wherein the determined data retention lifetime is 10 years of continuous use at 85 degrees Celsius.

6. The method of claim 1, further comprising performing lifetime testing on the ferroelectric memory device to determine estimated data retention lifetimes for the memory cells.

7. The method of claim 6, wherein the lifetime testing is performed prior to selecting the time parameter and the temperature parameter, and wherein the time parameter and the temperature parameter are further selected as a function of the estimated data retention lifetimes.

8. The method of claim 6, wherein performing lifetime testing comprises performing a number of lifetime test cycles comprising:
    writing same state data to a first capacitor and a second capacitor of the ferroelectric memory device;
    baking the first capacitor and the second capacitor for a selected time at a selected temperature;
    performing a same state read on the first capacitor and the second capacitor to obtain same state read data;
    comparing the same state read data with the written same state data;
    re-writing the same state read data to the first capacitor and the second capacitor;
    writing opposite state data to the first capacitor and the second capacitor;
    waiting a selected period of time so that the first capacitor and the second capacitor reach steady state;
    performing an opposite state read to obtain opposite state read data; and
    comparing the opposite state read data with the opposite state data.

9. The method of claim 8, wherein the same state data is "0" for the first capacitor and "1" for the second capacitor and the opposite state data is "1" for the first capacitor and "0" for the second capacitor.

10. The method of claim 1, wherein the time parameter, the temperature parameter, and the initial state are selected to yield a data retention lifetime for the memory cells of the device that is greater than or equal to about the desired data retention lifetime.

11. The method of claim 1, further comprising performing a probe procedure that tests read/write capabilities of the memory cells.

12. The method of claim 1, wherein the selected initial state is selected to be positive.

13. The method of claim 1, wherein the selected initial state is selected to be negative.

14. The method of claim 1, further comprising packaging the memory device.

15. The method of claim 1, wherein performing lifetime testing comprises performing a number of lifetime test cycles comprising:
    writing data of a first state to a first capacitor of the ferroelectric memory device;
    baking the first capacitor for a selected time at a selected temperature;
    performing a same state read on the first capacitor to obtain same state read data and remaining charge of the first capacitor in the first state;
    comparing the same state read data with the written same state data;
    re-writing the same state read data to the first capacitor;
    writing opposite state data to the first capacitor;
    waiting a selected period of time so that the first capacitor reaches steady state;
    performing an opposite state read to obtain opposite state read data and remaining charge of the first capacitor in the opposite state; and
    comparing the opposite state read data with the opposite state data.

16. The method of claim 15, further comprising analyzing the obtained remaining charge data to determine data retention for the first state and the opposite state.

17. A method of fabricating a ferroelectric memory device comprising:
    performing data retention lifetime testing on the ferroelectric memory device to obtain a tested data retention lifetime;
    selecting a desired data retention lifetime;

comparing the desired data retention lifetime to the tested data retention lifetime;

selecting a bake parameter according to the desired data retention lifetime and the tested data retention lifetime; and baking the ferroelectric memory device at least partially according to the bake parameters to cause the ferroelectric memory device to have at least the desired data retention lifetime.

18. The method of claim 17, further comprising verifying the data retention lifetime for the ferroelectric memory device after baking the ferroelectric memory device.

19. The method of claim 17, wherein baking the ferroelectric device is not performed on the tested data retention lifetime being at least equal to the desired data retention lifetime.

20. A method of packaging a ferroelectric memory device comprising:

selecting packaging parameters including a process time and a process temperature;

performing data retention lifetime testing on the ferroelectric memory device to obtain a tested data retention lifetime;

adjusting the process time and the process temperature according to the obtained tested data retention lifetime and a suitable data retention lifetime, wherein the process time and the process temperature are selected to selectively improve data retention of the memory device; and packaging the device according to the one or more packaging parameters.

21. The method of claim 20, wherein the process time is about 15 seconds.

22. The method of claim 20, wherein the process temperature is greater than 200 degrees Celsius.

23. The method of claim 20, wherein the suitable data retention lifetime is about 10 years at about 85 degrees Celsius.

* * * * *